US012728430B2

(12) United States Patent
Kim et al.

(10) Patent No.: US 12,728,430 B2
(45) Date of Patent: Sep. 8, 2026

(54) LINEAR EVAPORATION SOURCE

(71) Applicant: SVMTECH CO., LTD., Incheon (KR)

(72) Inventors: Ki Su Kim, Incheon (KR); Si Hyun Lee, Yongin-Si (KR)

(73) Assignee: SVMTECH CO., LTD., Incheon (KR)

( * ) Notice: Subject to any disclaimer, the term of this patent is extended or adjusted under 35 U.S.C. 154(b) by 469 days.

(21) Appl. No.: 18/340,429

(22) Filed: Jun. 23, 2023

(65) Prior Publication Data

US 2024/0131535 A1 Apr. 25, 2024
US 2024/0226925 A9 Jul. 11, 2024

(30) Foreign Application Priority Data

Oct. 25, 2022 (KR) ........................ 10-2022-0138717
Oct. 25, 2022 (KR) ........................ 10-2022-0138718
Oct. 25, 2022 (KR) ........................ 10-2022-0138719
Oct. 25, 2022 (KR) ........................ 10-2022-0138720
Oct. 25, 2022 (KR) ........................ 10-2022-0138721

(51) Int. Cl.
*B05B 1/24* (2006.01)
*B05B 1/04* (2006.01)
*C23C 14/24* (2006.01)
*C23C 14/26* (2006.01)

(52) U.S. Cl.
CPC ................ *B05B 1/24* (2013.01); *B05B 1/044* (2013.01); *C23C 14/243* (2013.01); *C23C 14/26* (2013.01)

(58) Field of Classification Search
CPC ......... B05B 1/24; B05B 1/044; C23C 14/243; C23C 14/26
USPC .................................. 118/723 VE, 726, 727
See application file for complete search history.

(56) References Cited

U.S. PATENT DOCUMENTS

2016/0258051 A1 9/2016 Liu
2018/0037982 A1* 2/2018 An .......................... C23C 14/26

FOREIGN PATENT DOCUMENTS

CN 107916401 A * 4/2018
CN 213507164 U 6/2021
JP 2012-184486 * 9/2012
JP 2012184486 A 9/2012
KR 10-2005-0047940 * 5/2005
KR 20060111040 A 10/2006
KR 20110005636 A 1/2011
KR 10-2011-0139575 * 12/2011
KR 101462592 B1 11/2014

(Continued)

OTHER PUBLICATIONS

Machine Translation 10-2019-0080372 (Year: 2019).*

(Continued)

*Primary Examiner* — Rodney G McDonald
(74) *Attorney, Agent, or Firm* — Osha Bergman Watanabe & Burton LLP

(57) ABSTRACT

The present invention provides a linear evaporation source which receives heat from a crucible such that heat is uniformly distributed while a uniform heat distribution cover is seated on an accommodation case. The provided linear evaporation source includes an accommodation case forming an accommodation space with an open upper side, a crucible accommodated in the accommodation space and configured to discharge a deposition material, and a uniform heat distribution cover configured to cover the accommodation case to uniformly distribute a temperature by receiving heat from the crucible.

11 Claims, 20 Drawing Sheets

(56) References Cited

FOREIGN PATENT DOCUMENTS

| | | | | |
|---|---|---|---|---|
| KR | 20170032781 | A | | 3/2017 |
| KR | 20180016693 | A | | 2/2018 |
| KR | 20180046306 | A | | 5/2018 |
| KR | 20180051204 | A | | 5/2018 |
| KR | 10-2019-0080372 | | * | 7/2019 |
| KR | 102020768 | B1 | | 9/2019 |
| KR | 20190137999 | A | | 12/2019 |
| KR | 20210034811 | A | | 3/2021 |
| KR | 10-2022-0132707 | | * | 10/2022 |
| KR | 20220132707 | A | | 10/2022 |
| TW | 1589716 | B | * | 7/2017 |

OTHER PUBLICATIONS

Machine Translation 10-2005-0047940 (Year: 2005).*
Machine Translation JP 2012-184486 (Year: 2012).*
Machine Translation CN 107916401 A (Year: 2018).*
Machine Translation KR 10-2011-0139575 (Year: 2011).*
Machine Translation KR 10-2022-0132707 (Year: 2022).*
Machine Translation TW 1589716 B (Year: 2017).*
Office Action issued in corresponding Korean Patent Application No. 10-2022-0138717 dated Aug. 28, 2024 (5 pages).
Office Action issued in corresponding Korean Patent Application No. 10-2022-0138718 dated Aug. 28, 2024 (5 pages).
Office Action issued in corresponding Korean Patent Application No. 10-2022-0138720 dated Sep. 3, 2024 (4 pages).
Office Action issued in corresponding Korean Patent Application No. 10-2022-0138721 dated Sep. 5, 2024 (5 pages).

* cited by examiner

LINEAR EVAPORATION SOURCE

CROSS-REFERENCE TO RELATED APPLICATION

This application claims priority to and the benefit of Korean Patent Application No. 2022-0138717, 2022-0138718, 2022-0138719, 2022-0138720, 2022-0138721 filed on Oct. 25, 2022, the disclosure of which is incorporated herein by reference in its entirety.

BACKGROUND

1. Field of the Invention

The present invention relates to a linear evaporation source, and more particularly, to a linear evaporation source which receives heat from a crucible such that heat is uniformly distributed while a uniform heat distribution cover is seated on an accommodation case.

2. Discussion of Related Art

With the rapid development of information and communication technologies and the expansion of the market, flat panel displays are being spotlighted as displays.

Examples of such flat panel displays include liquid crystal displays, plasma display panels, organic electroluminescent elements (organic light-emitting diodes (OLEDs), and the like.

Among the above-described flat panel displays, the organic electroluminescent element, for example, the OLED, is being spotlighted as a next generation display because of its quick response speed, power consumption lower than that of a conventional liquid crystal display (LCD), light weight, and high brightness, and it does not need a separate backlight unit and therefore may be manufactured as an ultra slim type.

In an organic electroluminescent element, a positive electrode film, an organic thin film, and a negative electrode film are stacked on a substrate in order, and a voltage is applied between the positive electrode and the negative electrode to form an appropriate energy difference in the organic thin film so that the organic electroluminescent element emits light by itself. Such an organic electroluminescent element is manufactured with a substrate deposition apparatus.

In this case, a linear evaporation source for spraying a deposition material toward a substrate is provided in a substrate deposition apparatus to which vapor deposition (thermal evaporation) is applied. Here, a linear evaporation source applies heat through a heater to deposit a deposition material discharged through a nozzle to the same thickness on a substrate.

However, since most linear evaporation sources are formed as a single rectangular parallelepiped box that is laterally elongated, even when heating is performed at the same temperature, a temperature distribution may not be accurate in a length direction, and a spray amount of a deposition material may be different for each portion according to various other environmental factors. In this case, since the deposition material may not be deposited to the same thickness on the entire surface of a substrate, a nozzle tuning process is used to change a diameter of a nozzle and adjust the spray amount of the deposition material.

However, a nozzle tuning process has a limitation in that it can be performed in an atmospheric state but not in a vacuum state, and thus the nozzle tuning process has a time constraint and requires nozzles having a plurality of diameters, which is disadvantageous in terms of costs.

Therefore, there is a need to overcome such a limitation.

(Patent Document 1) Korean Patent Registration No. 10-2020768 (Jan. 5, 2011)

SUMMARY OF THE INVENTION

The present invention is directed to providing a linear evaporation source in which, when heat of a crucible is conducted to a uniform heat distribution cover, a temperature of the entire area of the uniform heat distribution cover may uniformly rise so that a deposition material may be deposited to a uniform thickness on a deposition target.

The present invention is also directed to providing a linear evaporation source in which a heat conduction prevention member is provided between a crucible and an accommodation case to prevent heat of the crucible from being conducted to the accommodation case, thereby improving heat insulation performance of the crucible.

The present invention is also directed to providing a linear evaporation source in which a heat loss prevention member is provided between a uniform heat distribution cover and an accommodation case to prevent heat of the uniform heat distribution cover from being conducted to the accommodation case, thereby allowing the entire area of the uniform heat distribution cover to emit heat at a uniform temperature.

The present invention is also directed to providing a linear evaporation source in which, by using a leakage prevention connector, a storage case and a seating cover are connected to prevent heat loss, and a vaporized deposition material is prevented from leaking between the storage case and the seating cover to improve airtightness.

The present invention is also directed to providing a linear evaporation source in which, when a deposition material filling a storage case is vaporized and discharged from a crucible, a temperature and air pressure of the deposition material are uniformly formed by a uniform discharge guide part, thereby depositing the deposition material to a uniform thickness on a deposition target.

According to an aspect of the present invention, there is provided a linear evaporation source including an accommodation case forming an accommodation space with an open upper side, crucibles accommodated in the accommodation space and configured to discharge a deposition material, and a uniform heat distribution cover configured to cover the accommodation case to uniformly distribute a temperature by receiving heat from the crucible.

The linear evaporation source may further include a plurality of heat conduction prevention members provided between the crucible and the accommodation case to support the crucible such that the heat of the crucible is prevented from being conducted to the accommodation case.

The heat conduction prevention members may be prevented from moving in a width direction of the accommodation case by a movement prevention portion.

The linear evaporation source may further include a plurality of heat loss prevention members provided between the accommodation case and the uniform heat distribution cover to support the uniform heat distribution cover such that the heat of the uniform heat distribution cover is prevented from being conducted to the accommodation case.

The heat loss prevention members may be prevented from being separated between the accommodation case and the uniform heat distribution cover by a separation prevention portion.

The uniform heat distribution cover may include a seating portion seated on the accommodation case, and a backflow prevention fitting portion which is provided at the seating portion and has a fitting hole inserted onto a discharge nozzle provided in the crucible to prevent a backflow of the deposition material discharged from the crucible.

The backflow prevention fitting portion may be accommodated in the accommodation space and formed to extend from the seating portion to form a communication space which communicates with the discharge nozzle.

The fitting hole may be formed at a position that is at a lower level than a position of an end of the discharge nozzle.

The crucible may include a storage case forming a storage space with an open upper side to store the deposition material, a seating cover which is seated on the storage case and includes a discharge nozzle which communicates with the storage space, and a leakage prevention connector configured to connect the storage case and the seating cover to prevent the vaporized deposition material from leaking between the storage case and the seating cover.

The leakage prevention connector may include a support flange extending in a perimetric direction on the storage case, a seating flange extending in the perimetric direction below the seating cover to be seated on the support flange, and a heat loss prevention coupling part configured to couple the support flange and the seating flange in close contact with each other.

The crucible may further include a uniform discharge guide part disposed in the storage space to guide the deposition material to be discharged from the discharge nozzle at a uniform temperature and air pressure.

The uniform discharge guide part may include a body accommodated and seated in the storage space to be heated together with the storage case, and a plurality of air pressure maintenance holes formed in the body to uniformly maintain air pressure of the deposition material before the deposition material is discharged from the discharge nozzle.

The uniform discharge guide part may further include a temperature deviation prevention portion provided in the body to prevent occurrence of a temperature deviation in the body.

The linear evaporation source may further include an induction heater accommodated in the accommodation space and configured to inductively heat the crucible to vaporize the deposition material, wherein the crucible is provided as a plurality of crucibles to be accommodated in the induction heater.

The crucibles may be in electrical contact with each other while accommodated in the induction heater.

DETAILED DESCRIPTION OF EXEMPLARY EMBODIMENTS

Figure 1:
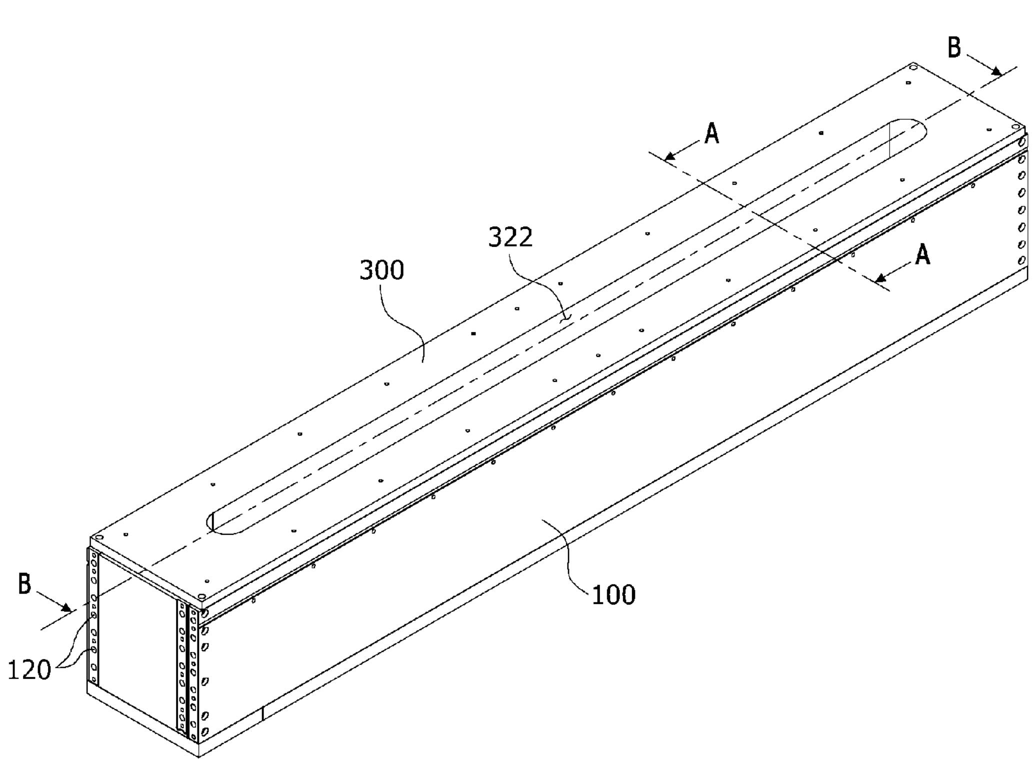
FIG. 1 is a perspective view illustrating a linear evaporation source according to one embodiment of the present invention.

Hereinafter, embodiments of a linear evaporation source according to the present invention will be described with reference to the accompanying drawings. In a process, thicknesses of lines or sizes of components shown in the drawings may be exaggerated for the sake of convenience and clarity in description.

Furthermore, terminologies used herein are defined by taking functions of the present invention into account and may be changed according to a custom or the intent of a user or an operator. Accordingly, the terminologies should be defined based on the following overall description of the present specification.

Figure 2:
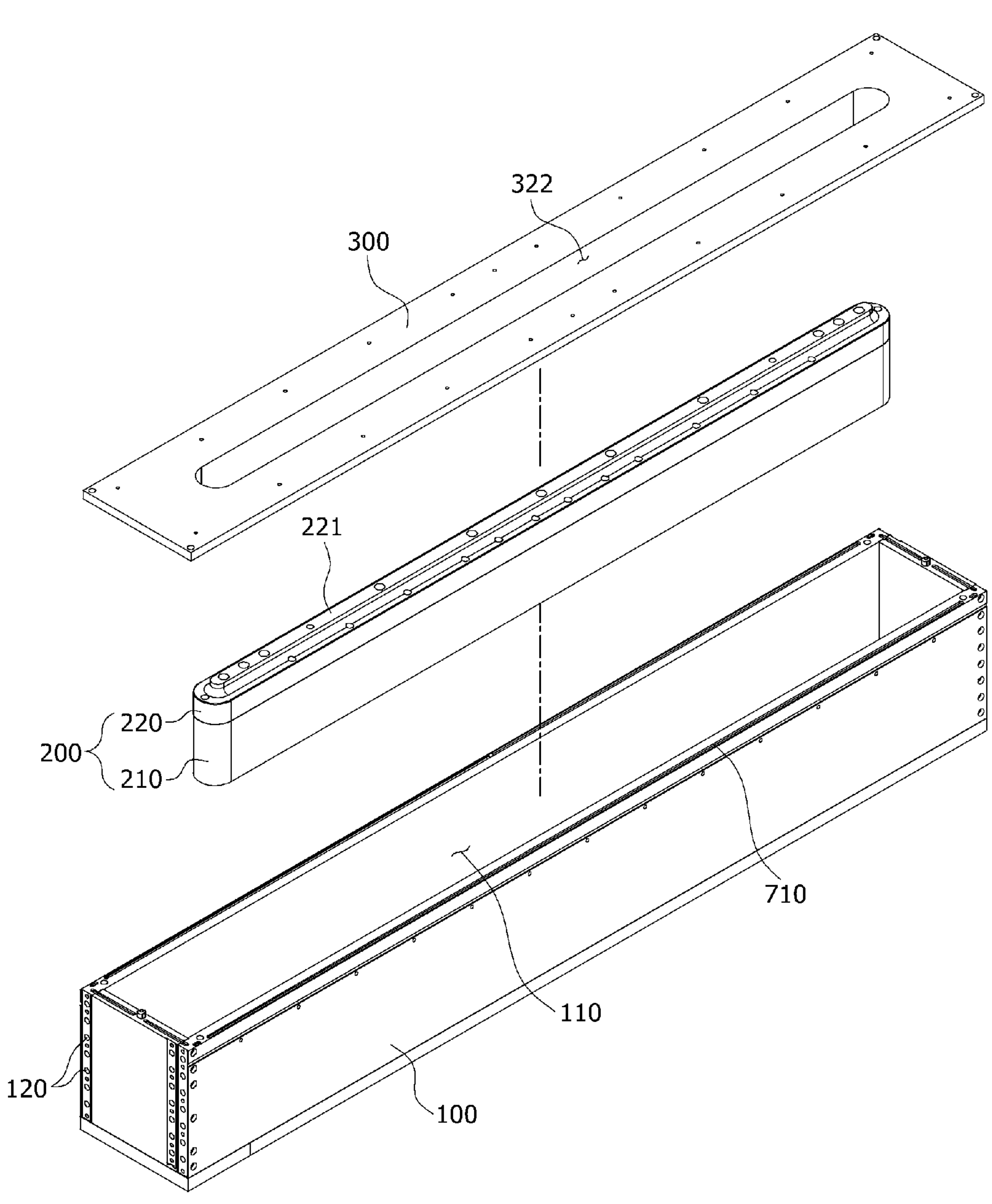
FIG. 2 is an exploded perspective view illustrating the linear evaporation source according to one embodiment of the present invention.
Figure 3:
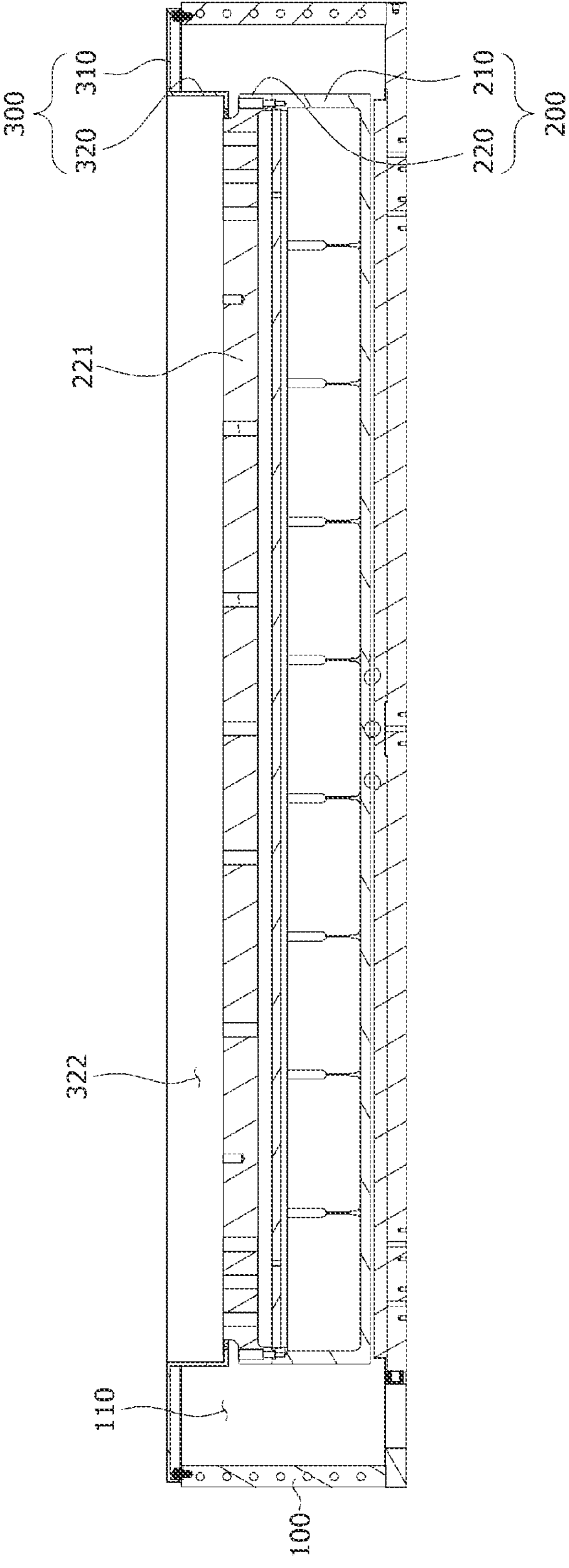
FIG. 3 is a side cross-sectional view illustrating the linear evaporation source according to one embodiment of the present invention.
Figure 4:
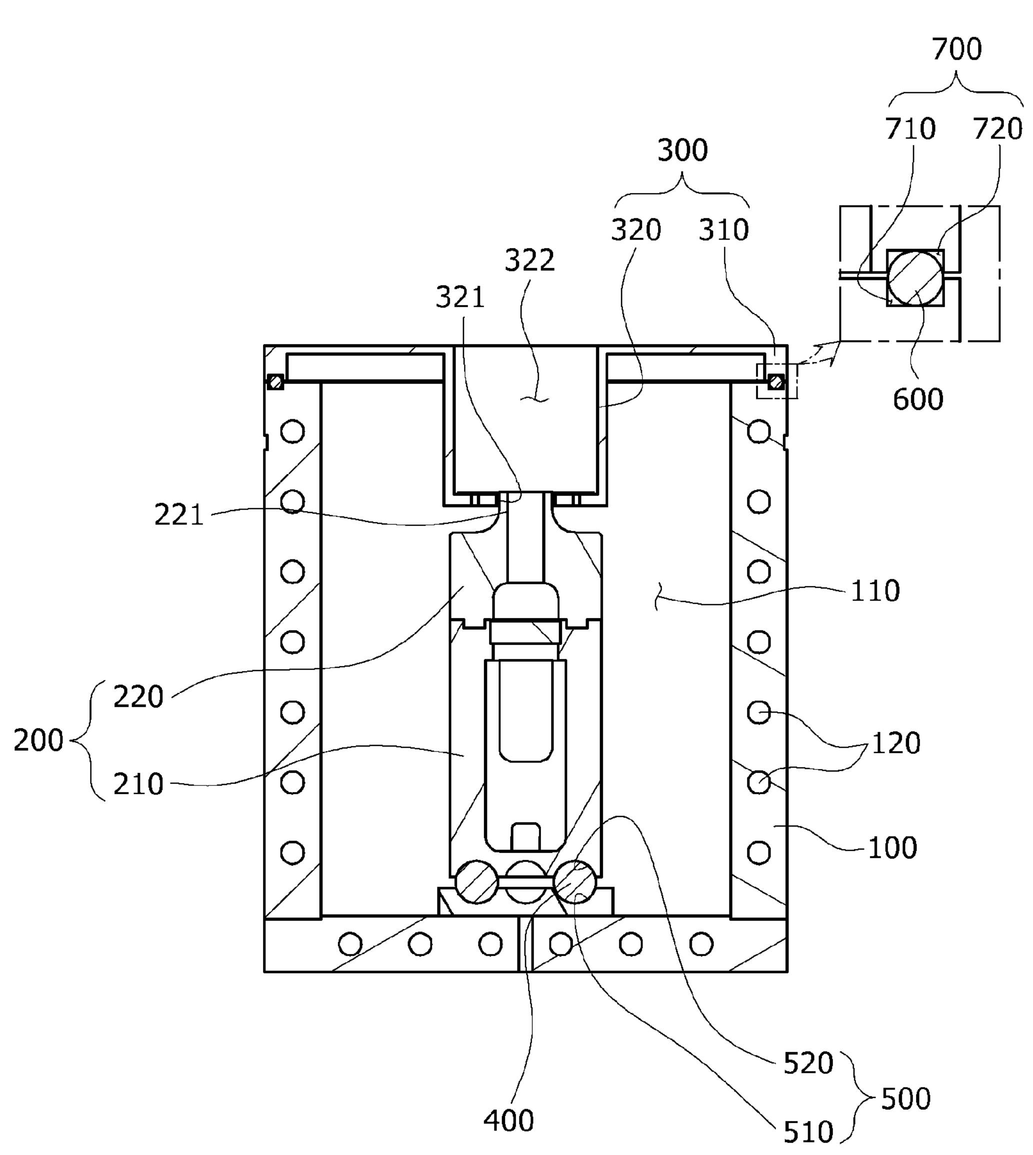
FIG. 4 is a front cross-sectional view illustrating the linear evaporation source according to one embodiment of the present invention.
Figure 5:
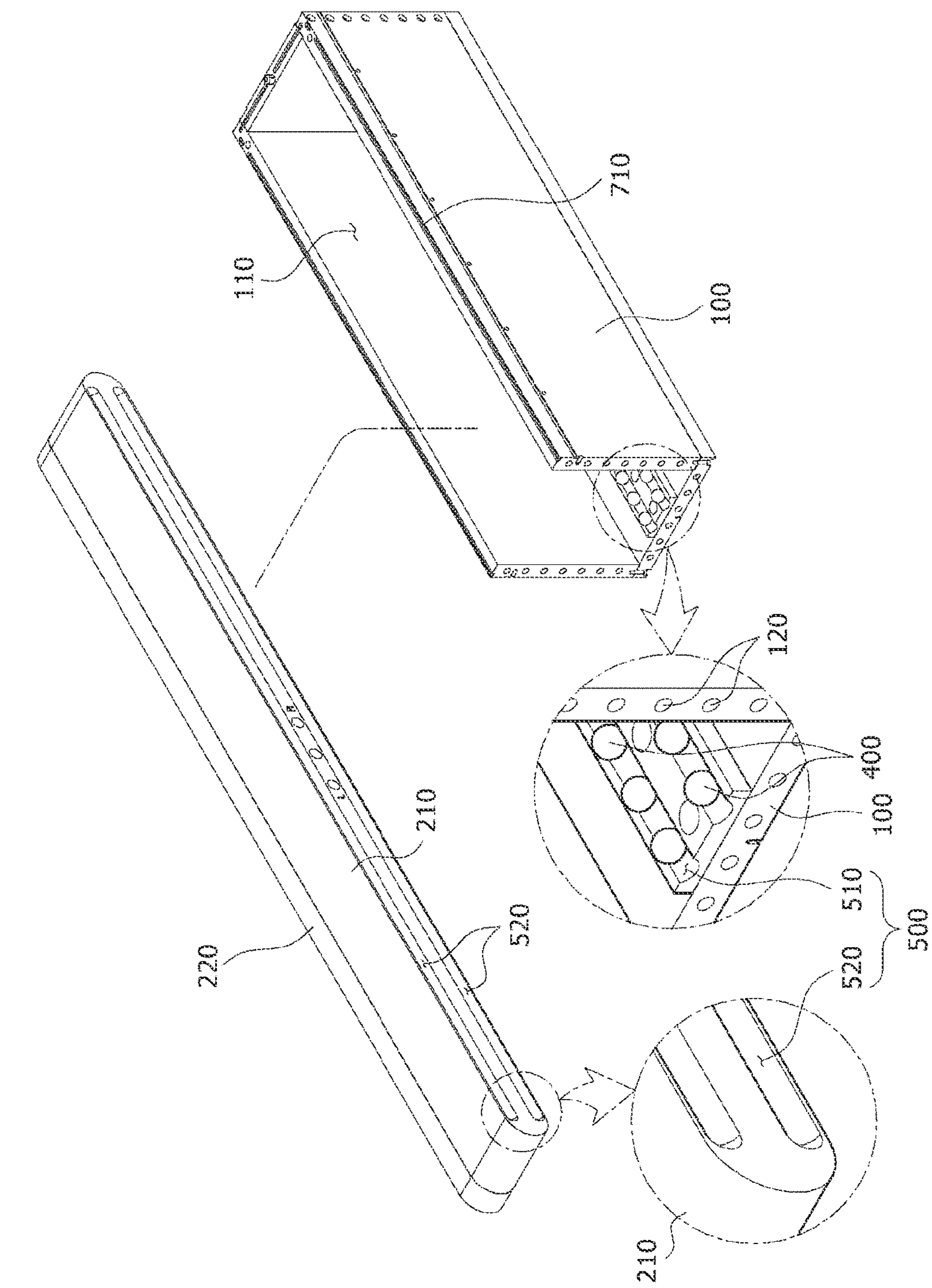
FIG. 5 is an exploded perspective view illustrating main components of a movement prevention portion in the linear evaporation source according to one embodiment of the present invention.
Figure 6:
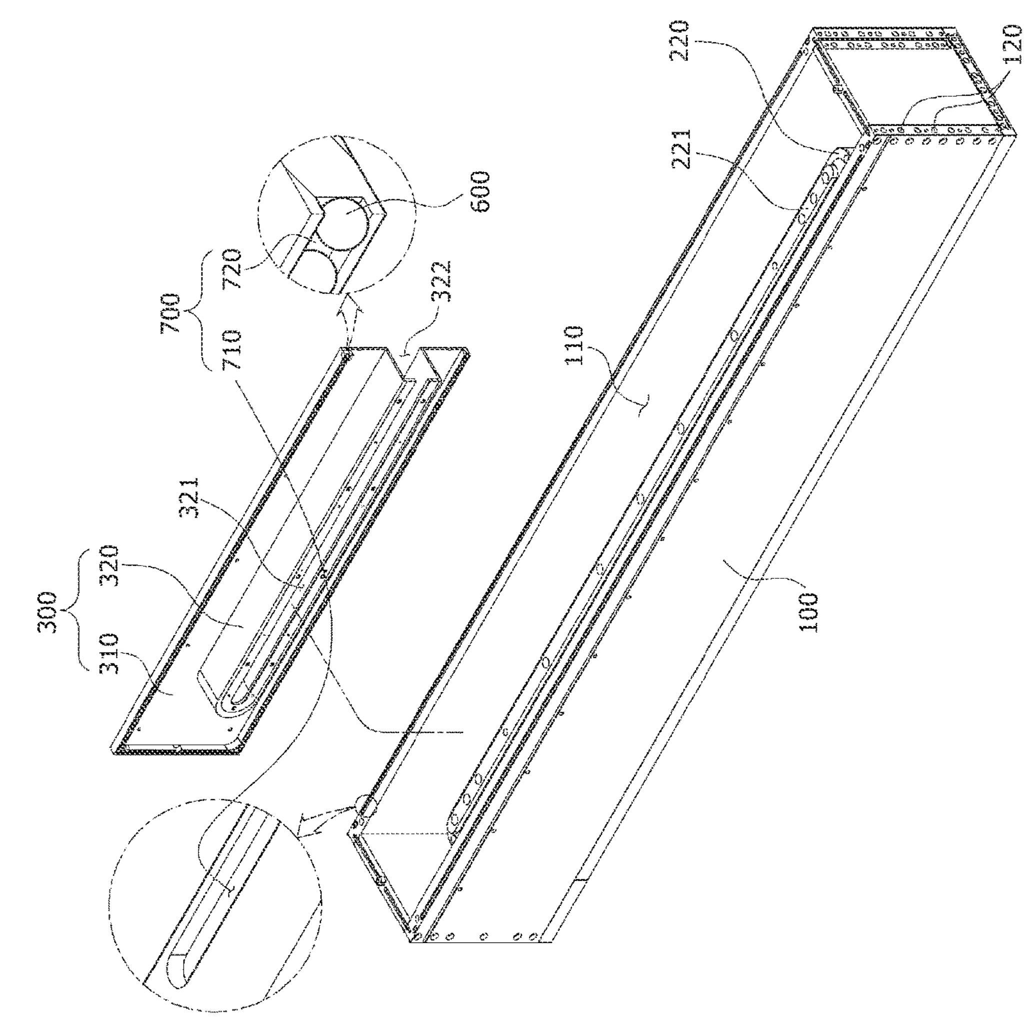
FIG. 6 is an exploded perspective view illustrating main components of a separation prevention portion in the linear evaporation source according to one embodiment of the present invention.
Figure 7:
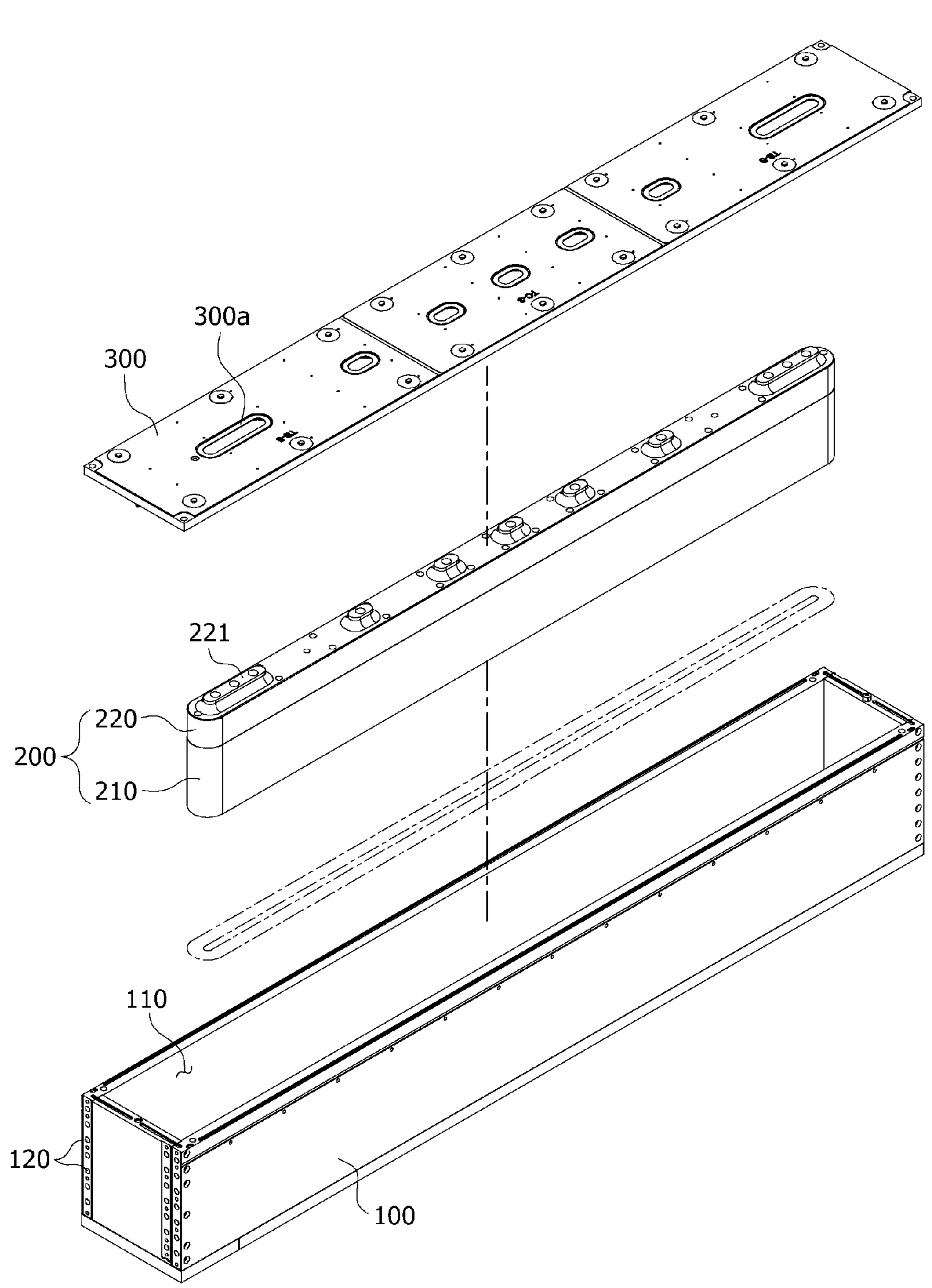
FIG. 7 is an exploded perspective view illustrating a modified example of a uniform heat distribution cover in the linear evaporation source according to one embodiment of the present invention.

FIG. 1 is a perspective view illustrating a linear evaporation source according to one embodiment of the present invention. FIG. 2 is an exploded perspective view illustrating the linear evaporation source according to one embodiment of the present invention. FIG. 3 is a side cross-sectional view illustrating the linear evaporation source according to one embodiment of the present invention. FIG. 4 is a front cross-sectional view illustrating the linear evaporation source according to one embodiment of the present invention. FIG. 5 is an exploded perspective view illustrating main components of a movement prevention portion in the linear evaporation source according to one embodiment of the present invention. FIG. 6 is an exploded perspective view illustrating main components of a separation prevention portion in the linear evaporation source according to one embodiment of the present invention. FIG. 7 is an exploded perspective view illustrating a modified example of a uniform heat distribution cover in the linear evaporation source according to one embodiment of the present invention.

Figure 8:
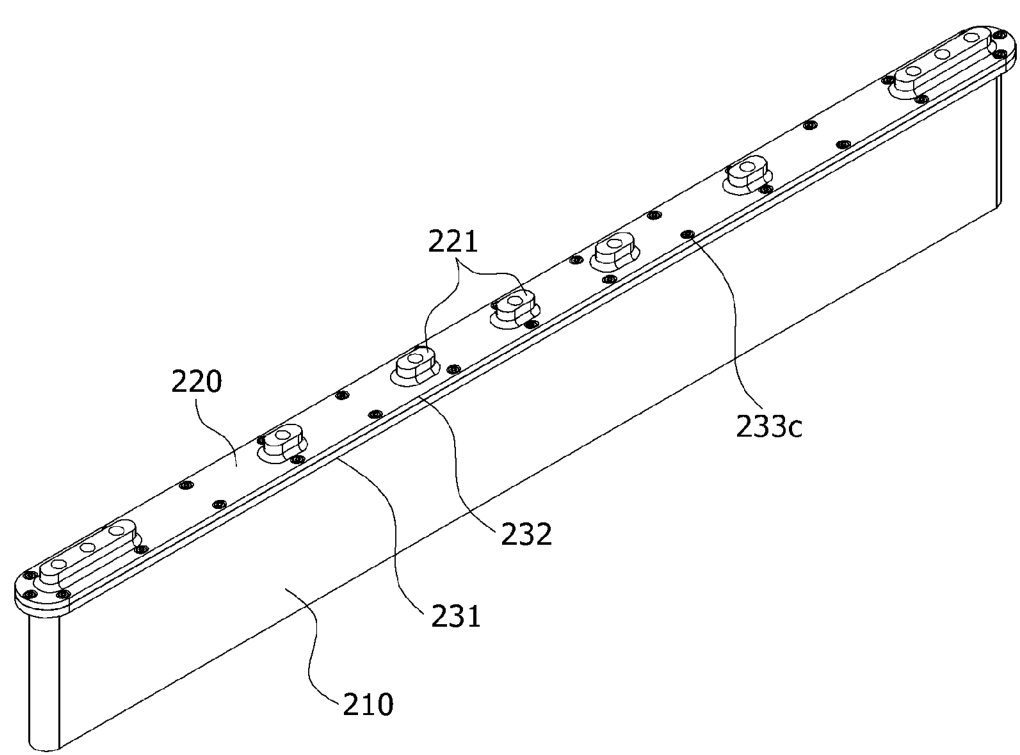
FIG. 8 is a perspective view illustrating a crucible in the linear evaporation source according to one embodiment of the present invention.
Figure 9:
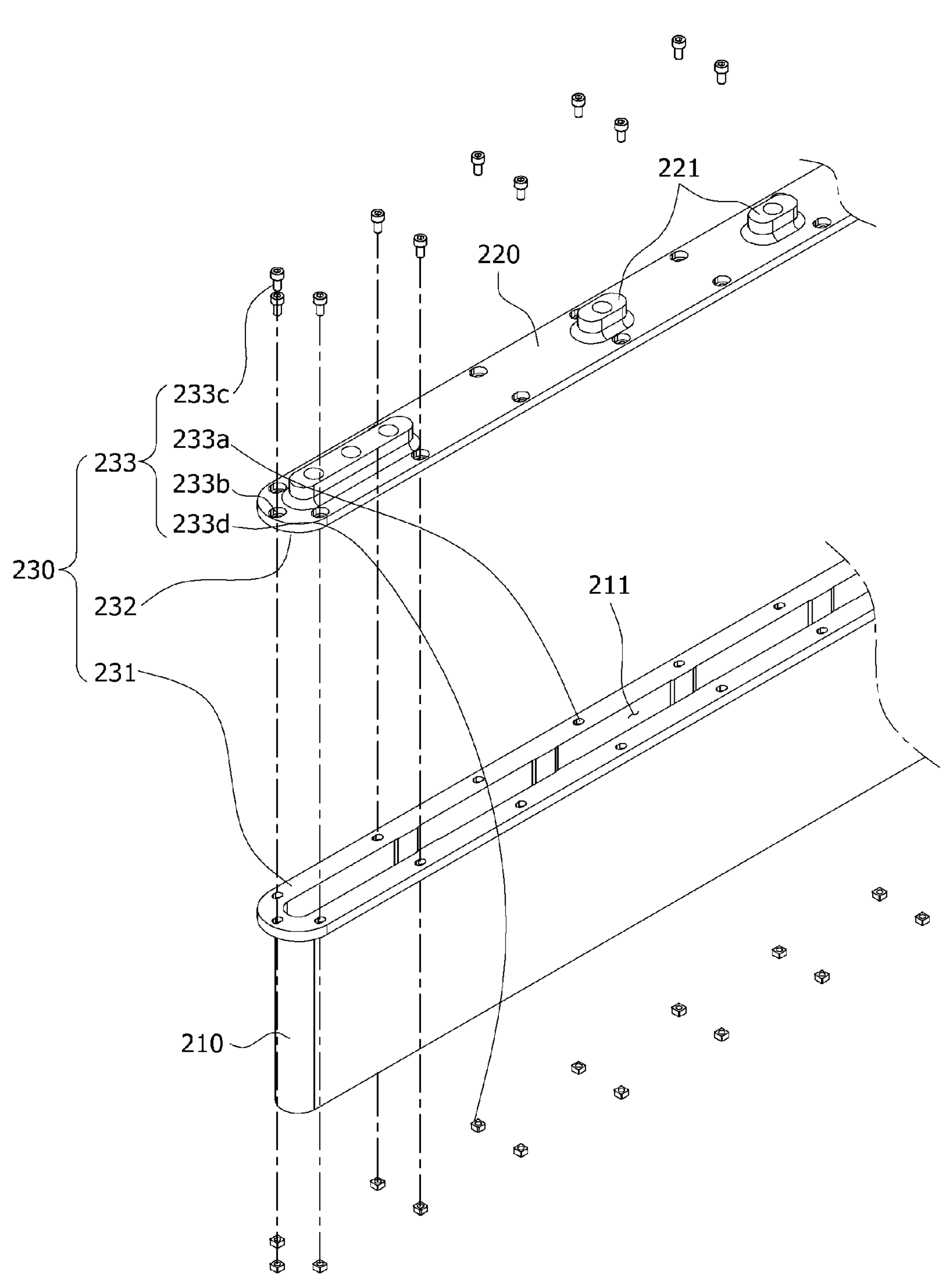
FIG. 9 is an exploded perspective view illustrating the crucible in the linear evaporation source according to one embodiment of the present invention.
Figure 10:
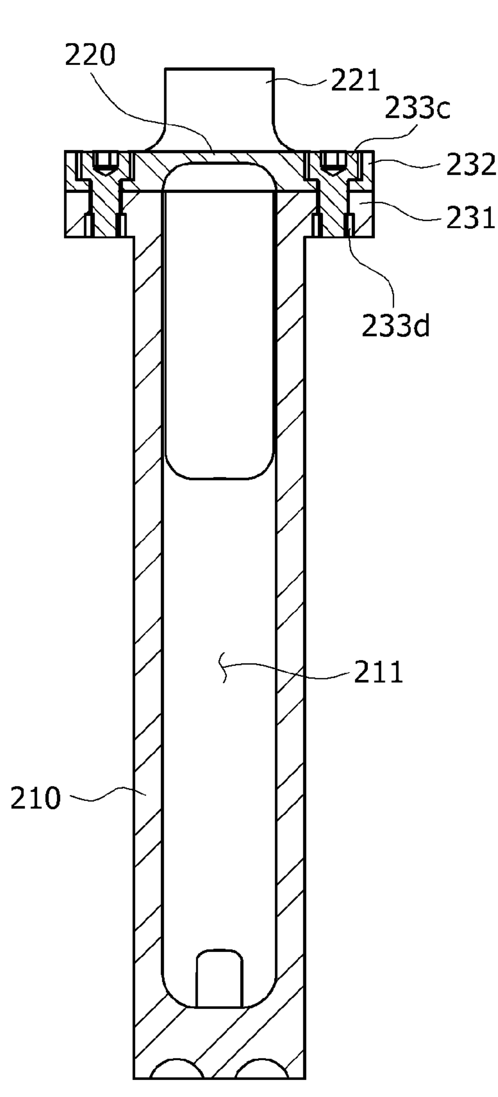
FIG. 10 is a cross-sectional view illustrating the crucible in the linear evaporation source according to one embodiment of the present invention.
Figure 11:
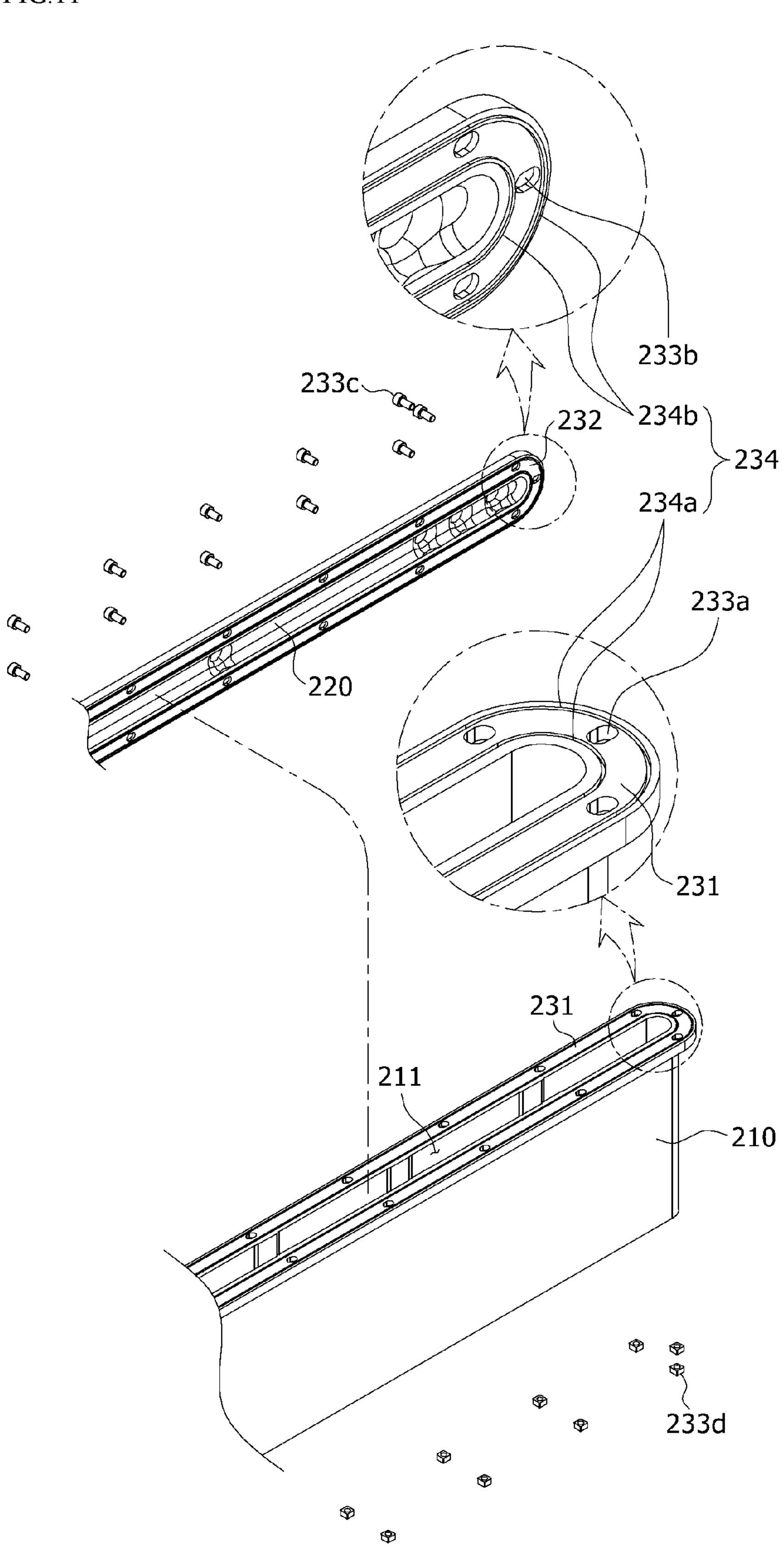
FIG. 11 is an exploded perspective view illustrating main components in a state in which an airtight reinforcement part is applied to the crucible in the linear evaporation source according to one embodiment of the present invention.
Figure 12:
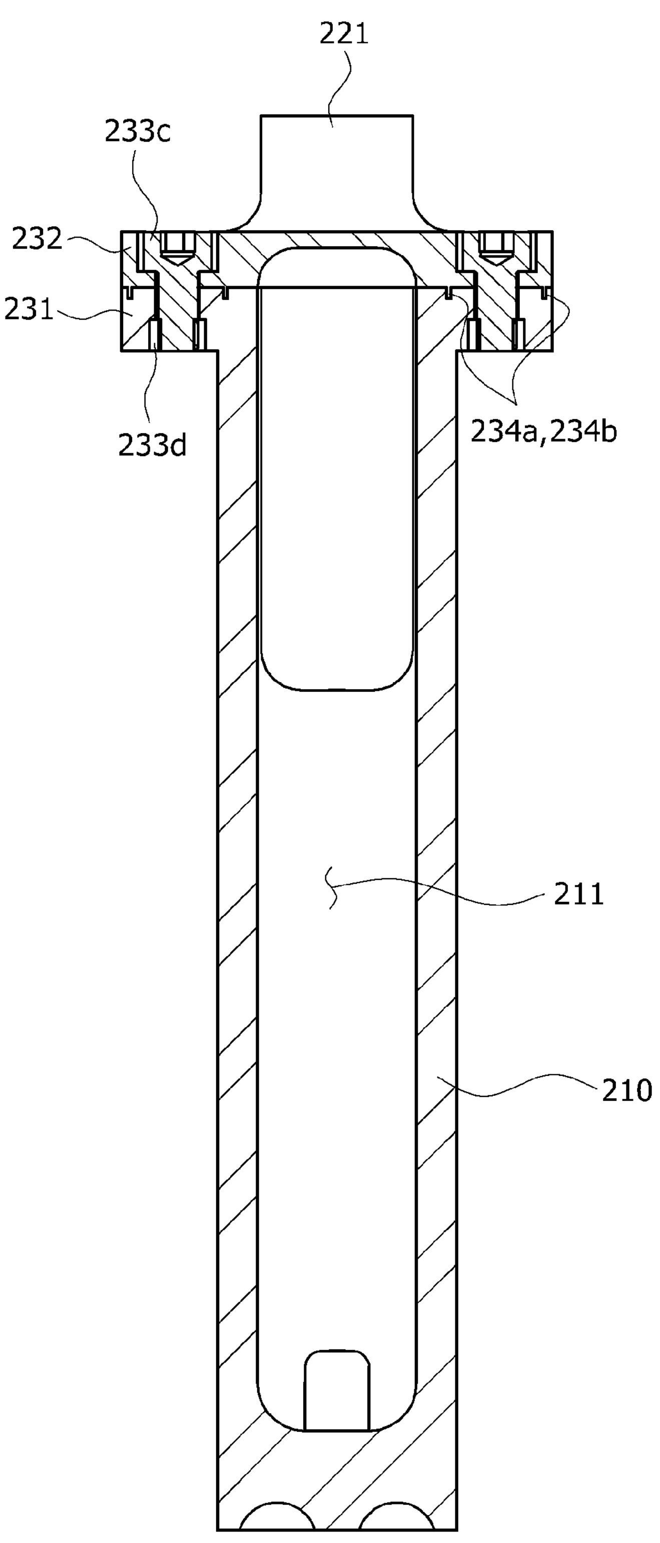
FIG. 12 is a cross-sectional view illustrating the airtight reinforcement part of the crucible in the linear evaporation source according to one embodiment of the present invention.

FIG. 8 is a perspective view illustrating a crucible in the linear evaporation source according to one embodiment of the present invention. FIG. 9 is an exploded perspective view illustrating the crucible in the linear evaporation source according to one embodiment of the present invention. FIG. 10 is a cross-sectional view illustrating the crucible in the linear evaporation source according to one embodiment of the present invention. FIG. 11 is an exploded perspective view illustrating a state in which an airtight reinforcement part is applied to the crucible in the linear evaporation source according to one embodiment of the present invention. FIG. 12 is a cross-sectional view illustrating the airtight reinforcement part of the crucible in the linear evaporation source according to one embodiment of the present invention.

Figure 13:
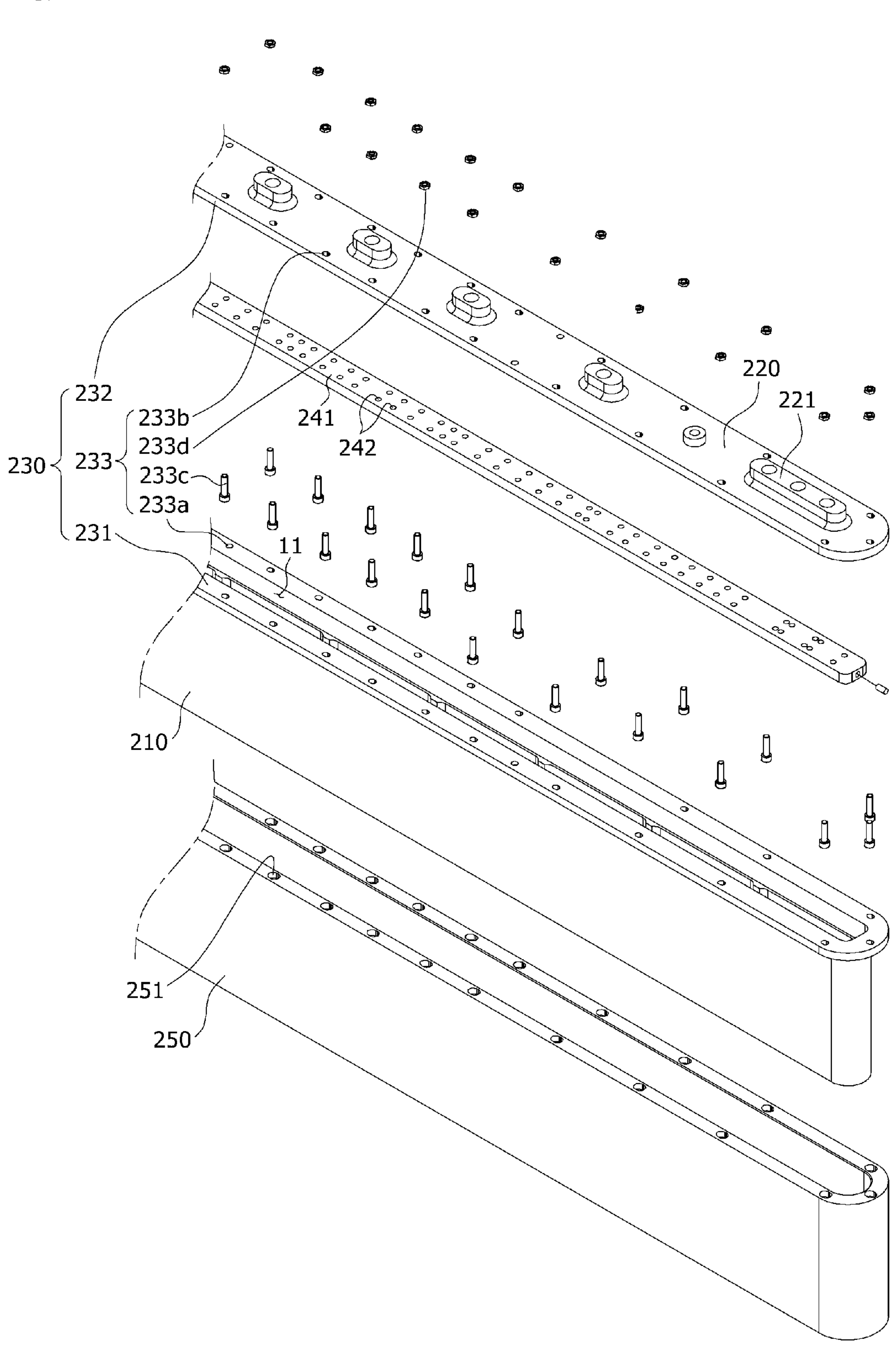
FIG. 13 is an exploded perspective view illustrating main components in a state in which a uniform discharge guide part is applied to the crucible in the linear evaporation source according to one embodiment of the present invention.
Figure 14:
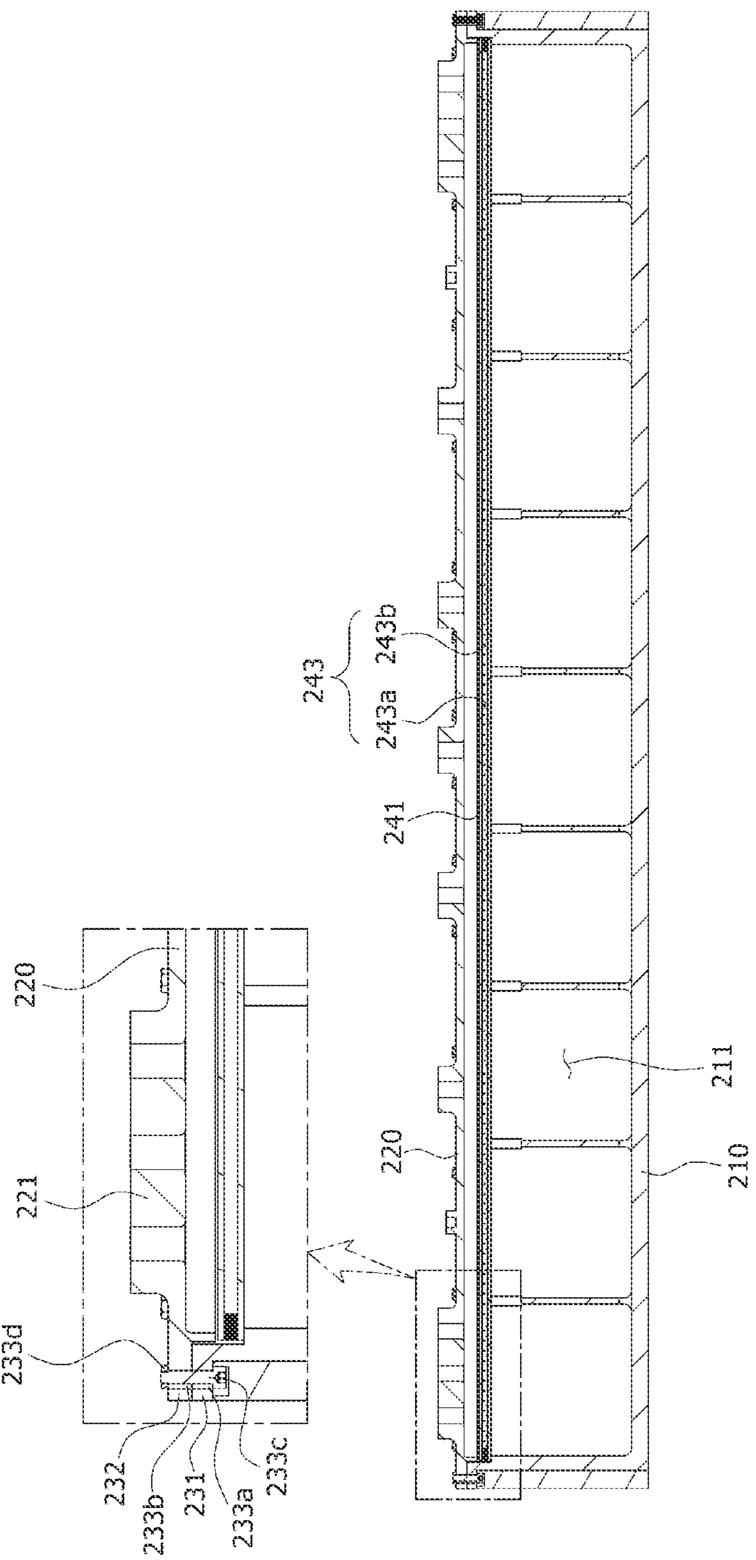
FIG. 14 is a side cross-sectional view illustrating a state in which a uniform discharge guide part is applied to the crucible in the linear evaporation source according to one embodiment of the present invention.
Figure 15:
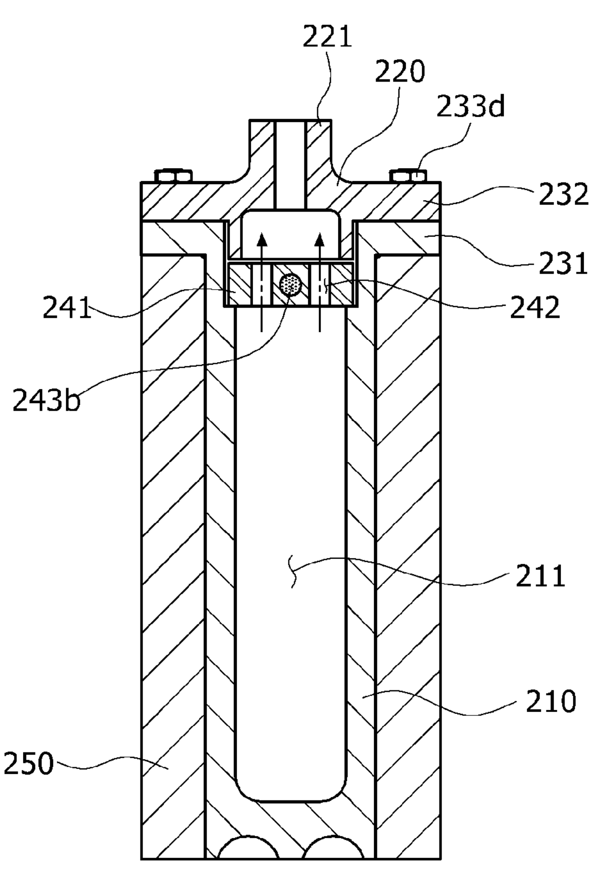
FIG. 15 is a front sectional view illustrating a state in which the uniform discharge guide part is applied to the crucible in the linear evaporation source according to one embodiment of the present invention.
Figure 16:
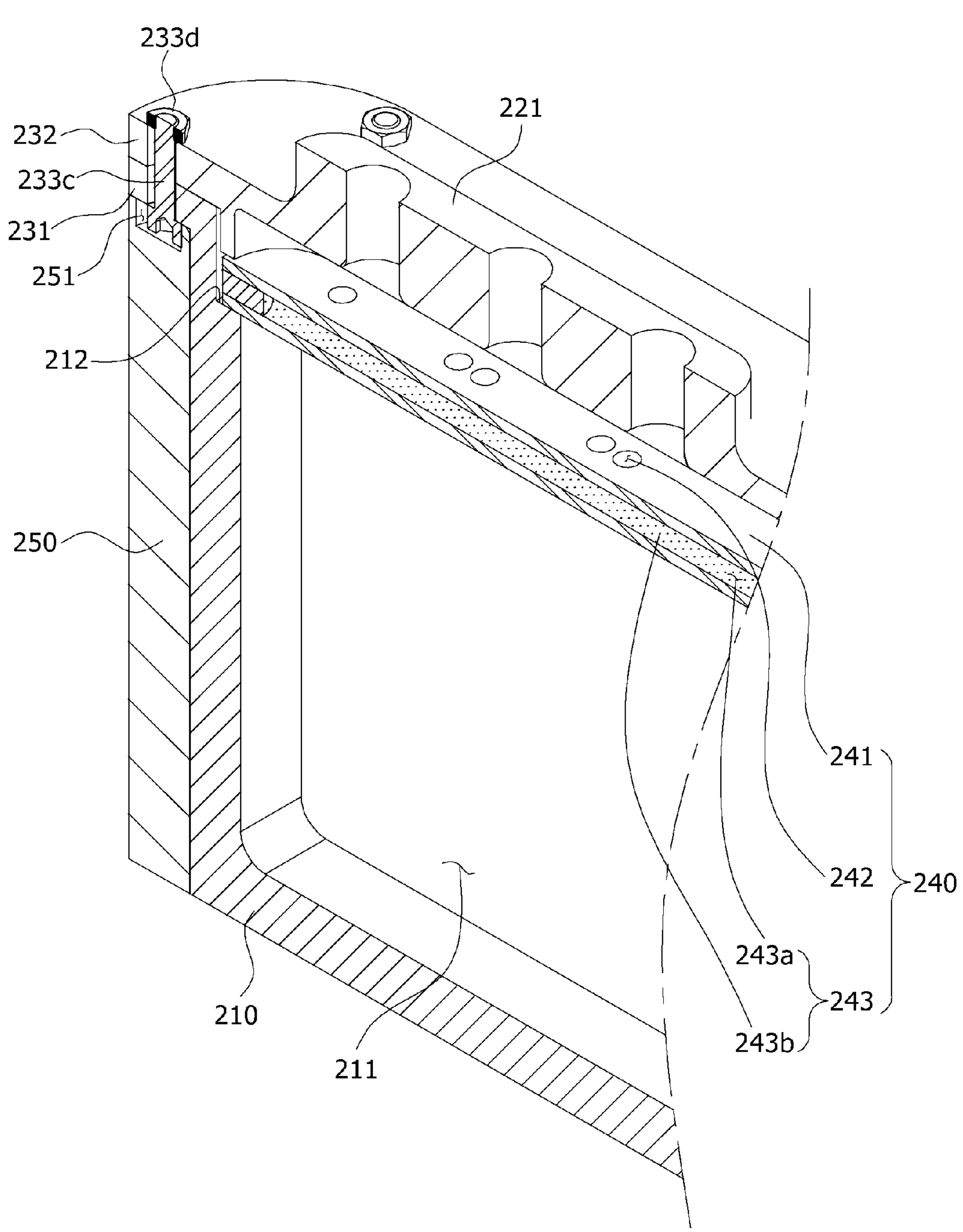
FIG. 16 is a cross-sectional perspective view illustrating a state in which the uniform discharge guide part is applied to the crucible in the linear evaporation source according to one embodiment of the present invention.

FIG. 13 is an exploded perspective view illustrating a state in which a uniform discharge guide part is applied to the crucible in the linear evaporation source according to one embodiment of the present invention. FIG. 14 is a side cross-sectional view illustrating a state in which the uniform discharge guide part is applied to the crucible in the linear evaporation source according to one embodiment of the present invention. FIG. 15 is a front sectional view illustrating a state in which the uniform discharge guide part is applied to the crucible in the linear evaporation source according to one embodiment of the present invention. FIG. 16 is a cross-sectional perspective view illustrating a state in which the uniform discharge guide part is applied to the crucible in the linear evaporation source according to one embodiment of the present invention. FIGS. 17 to 20 are perspective views illustrating an arrangement relationship between the crucible and an induction heater in the linear evaporation source according to one embodiment of the present invention.

The linear evaporation source according to one embodiment of the present invention is installed in a vacuum chamber to deposit a surface treatment material on a substrate in an organic light-emitting diode (OLED) manufacturing process and heats and vaporizes a deposition material in the form of a liquid or powder to discharge the deposition material toward a deposition target to be surface-treated.

The linear evaporation source according to the present embodiment may be used in a field of a technology for surface-treating a metal and the like as well as an OLED manufacturing process.

As shown in FIGS. 1 to 20, the linear evaporation source according to one embodiment of the present invention includes an accommodation case 100, a crucible 200, and a uniform heat distribution cover 300.

The accommodation case 100 forms an accommodation space 110 with an open upper side.

The accommodation case 100 serves to accommodate the crucible 200 to prevent thermal energy of the crucible 200 from diffusing to the outside and simultaneously serves to provide a space in which the uniform heat distribution cover 300 may be installed and seated to receive thermal energy of the crucible 200.

In this case, a plurality of circulation holes 120 are formed in the accommodation case 100 such that a coolant passes therethrough in a longitudinal direction thereof. The circulation holes 120 may be connected to a coolant supply line and a coolant discharge line for supplying and circulating a coolant and may have various shapes and sizes according to a size and area of the accommodation case 100.

The crucible 200 is accommodated in the accommodation space 110 to discharge a deposition material. The crucible 200 is inductively heated by high-frequency oscillation and serves to vaporize and discharge the deposition material filling the crucible 200.

Of course, the crucible 200 may be made of at least one selected from among quartz, graphite series, tantalum, titanium, and alumina which have excellent heat resistance, an electrical insulating property, and heat retention and may be formed in a dual structure made of different materials to further improve thermal efficiency and properly maintain electrical conductivity.

Specifically, as shown in FIGS. 8 to 16, the crucible 200 may include a storage case 210 which forms a storage space 211 with an open upper side and accommodates a deposition material, a seating cover 220 which is seated on the storage case 210 and includes discharge nozzles 221 communicating with the storage space 211, and a leakage prevention connector 230 which connects the storage case 210 and the seating cover 220 to prevent a vaporized deposition material from leaking between the storage case 210 and the seating cover 220.

Here, the leakage prevention connector 230 is a component which increases a contact area between the storage case 210 and the seating cover 220 to prevent the deposition material from leaking between the storage case 210 and the seating cover 220 in a process of vaporizing the deposition material in the storage case 210 and discharging the deposition material through the discharge nozzle 221.

To this end, the leakage prevention connector 230 includes a support flange 231 extending in a perimetric direction on the storage case 210, a seating flange 232 extending in the perimetric direction below the seating cover 220 to be seated on the support flange 231, and a heat loss prevention coupling part 233 which couples the support flange 231 and the seating flange 232 in close contact with each other such that heat loss is prevented when the storage case 210 and the seating cover 220 are inductively heated by high-frequency oscillation.

Specifically, the heat loss prevention coupling part 233 includes a plurality of first fastening holes **233*a* formed in the support flange 231, a plurality of second fastening holes 233*b* formed in the seating flange 232 to communicate with the first fastening holes 233*a*, fastening bolts 233*c* inserted into the first fastening holes 233*a* and the second fastening holes 233*b*, and fastening nuts 233*d* fastened to the fastening bolts 233*c* to prevent the fastening bolts 233*c* from being separated from the first fastening holes 233*a* and the second fastening holes 233*b***.

In this case, the fastening bolt **233*c* and the fastening nut 233*d*** may be made of a material that has excellent thermal conductivity and may also be prevented from being deformed due to thermal expansion.

The fastening bolt 233*c* and the fastening nut 233*d* may have structures that are prevented from respectively protruding from the support flange 231 and the seating flange 232 when the fastening bolt 233*c* and the fastening nut 233*d* have been fastened to each other while inserted into the first fastening hole 233*a* and the second fastening hole 233*b*. Therefore, when the storage case 210 and the seating cover 220 are inductively heated by high-frequency oscillation, a phenomenon in which a current is concentrated toward the fastening bolt 233*c* is prevented and does not affect a temperature rise of the storage case 210 and the seating cover 220, thereby preventing unnecessary heat loss.

Of course, the fastening bolt 233*c* and the fastening nut 233*d* may also have structures that respectively protrude from the support flange 231 and the seating flange 232 when the fastening bolt 233*c* and the fastening nut 233*d* have been fastened to each other.

In addition, as shown in FIGS. 11 and 12, the leakage prevention connector 230 may further include an airtightness reinforcement part 234 which reinforces airtightness between the support flange 231 and the seating flange 232 when the heat loss prevention coupling part 233 couples the support flange 231 and the seating flange 232.

The airtightness reinforcement part 234 includes airtightness grooves 234*a* formed to be recessed from an upper side of the support flange 231 or a lower side of the seating flange 232 in a perimetric direction and airtightness protrusions 234*b* protruding from the lower side of the seating flange 232 or the upper side of the support flange 231 in the perimetric direction.

In this case, each of the airtightness groove 234*a* and the airtightness protrusion 234*b* may be formed in various ways at positions of the upper side of the support flange 231 and the lower side of the seating flange 232 at which interference with the first fastening hole 233*a* or the second fastening hole 233*b* is prevented.

Accordingly, when an upper side of the storage case 210 is covered with the seating cover 220, the airtightness reinforcement part 234 may guide a seating position of the seating cover 220 and may further increase a contact area between the support flange 231 and the seating flange 232 so that airtightness between the support flange 231 and the seating flange 232 can be further improved.

As shown in FIGS. 13 to 16, the crucible 200 may further include a uniform discharge guide part 240 disposed in the storage space 211 to guide a deposition material to be discharged from the discharge nozzle 221 at a uniform temperature and air pressure.

When the storage case 210 is inductively heated, the uniform discharge guide part 240 is heated simultaneously, and thus a temperature thereof rises. Accordingly, an internal temperature of the storage space 211 can be increased more rapidly, thereby improving an effect of heating a deposition material filling the storage space 211.

Specifically, the uniform discharge guide part 240 includes a body 241 accommodated and seated in the storage space 211, a plurality of air pressure maintenance holes 242 formed in the body 241 to maintain uniform air pressure of a deposition material before the deposition material is discharged from the discharge nozzle 221, and a temperature deviation prevention portion 243 provided in the body 241 to prevent the occurrence of a temperature deviation in the body 241 such that the deposition material passes through the air pressure maintenance hole 242 at a uniform temperature.

In this case, a support protrusion 212 is formed in the storage case 210 to support the body 241 to be seated in the storage space 211. In addition, a material of the body 241 is not particularly limited, but it is advantageous for the body 241 to be made of a copper material having excellent thermal conductivity.

The air pressure maintenance hole 242 is formed to pass through the body 241 to be misaligned with the discharge nozzle 221. Accordingly, when a deposition material passes through the air pressure maintenance hole 242, air pressure can be stably formed inside the seating cover 220, and thus the deposition material may be discharged at a constant speed and amount from each discharge nozzle 221 and deposited to a uniform thickness on a deposition target.

The temperature deviation prevention portion 243 includes a filling space 243*a* formed in the body 241 to prevent interference with the air pressure maintenance hole 242 and a thermal medium 243*b* which sealably fills the filling space 243*a* and transfers heat from the body 241 to a deposition material such that a temperature of the deposition material is uniform.

That is, the filling space 243*a* serves to provide a space in which the thermal medium 243*b* is sealably stored, and in a process in which a temperature of the body 241 rises, the thermal medium 243*b* transfers heat from a portion of the body 241 of which a temperature is relatively high to a portion of the body 241 of which a temperature is relatively low, thereby serving to promote a temperature of the body 241 reaching a set temperature in a balanced manner.

Although the filling space 243*a* is shown in the drawing as being formed as a linear closed space in a longitudinal direction of the body 241, the present invention is not limited thereto. The filling space 243*a* may be formed to be modified in various shapes as long as the filling space 243*a* is formed as a space that can be sealably filled with the thermal medium 243*b* while avoiding the air pressure maintenance hole 242.

Of course, the thermal medium 243*b* may be made of at least one selected from various materials capable of promoting heat balance of the body 241 when the entire area of the body 241 reaches a set temperature.

As a result, when a deposition material is vaporized in the storage case 210 and passes through the uniform discharge guide part 240, since the deposition material may have a uniform temperature as well as constant air pressure to be discharged from the discharge nozzle 221, the deposition material may be deposited to a uniform thickness on a deposition target.

In addition, a current concentration prevention cover 250 may be provided on a circumferential surface of the storage case 210 to prevent a current from being concentrated toward the fastening bolt 233*c* during induction heating.

The current concentration prevention cover 250 is formed to have open upper and lower sides, covers the circumferential surface of the storage case 210 to be prevented from being exposed, and simultaneously supports the support flange 231 to be seated thereon. Of course, the current concentration prevention cover 250 is made of a material having excellent thermal conductivity.

In this case, an accommodation groove 251 is formed on a portion of the current concentration prevention cover 250 on which the support flange 231 is seated to accommodate the fastening bolt 233*c*.

As a result, the current concentration prevention cover 250 covers the storage case 210 such that the fastening bolt 233C is prevented from being exposed from the support flange 231, during induction heating by high-frequency oscillation, and the current concentration prevention cover 250 may prevent a current from being concentrated on the fastening bolt 233*c* and may simultaneously transfer heat without an influence on a temperature rise of the storage case 210, thereby preventing heat loss from unnecessarily occurring in the storage case 210.

Meanwhile, the uniform heat distribution cover 300 covers the accommodation case 100 such that heat is received from the crucible 200 and a temperature is uniformly distributed.

The uniform heat distribution cover 300 may include a seating portion 310 seated on the accommodation case 100 and a backflow prevention portion 320 which is provided at the seating portion and has a fitting hole 321 that is fitted onto the discharge nozzle 221 to prevent a backflow of a deposition material discharged from the discharge nozzle 221. In this case, the backflow prevention portion 320 is accommodated in the accommodation space 110 and bent to extend from the seating portion 310 to form a communication space 322 communicating with the discharge nozzle 221.

That is, when a deposition material is discharged in a vaporized state from the discharge nozzle 221, since the backflow prevention portion 320 guides the deposition material through the communication space 322 to then be deposited on a deposition target, it is possible to minimize a phenomenon in which the deposition material flows back to the discharge nozzle 221 due to thermal expansion. In addition, since the backflow prevention portion 320 receives heat from the crucible 200 while accommodated in the accommodation space 110, it is possible to maintain a uniform temperature of the uniform heat distribution cover 300.

In this case, as shown in FIG. 7, when the plurality of discharge nozzles 221 of the crucible 200 are formed, the uniform heat distribution cover 300 may be formed to have a uniform thickness and have a plurality of fitting guide holes 300*a* which are to be fitted onto the discharge nozzles 221 of the crucible 200.

Here, in order to prevent heat of the crucible 200 from being conducted to the accommodation case 100, the linear evaporation source may further include a plurality of heat conduction prevention members 400 provided between the crucible 200 and the accommodation case 100 to support the crucible 200.

The heat conduction prevention member 400 serves to support the crucible 200 to prevent a phenomenon in which heat of the crucible 200 is conducted to the accommodation case 100 and lowers a heat-emission temperature of the crucible 200 in a process in which the crucible 200 is inductively heated to vaporize a filled deposition material The heat conduction prevention member 400 may be prevented from moving in a width direction of the accommodation case 100 by a movement prevention portion 500. Specifically, the movement prevention portion 500 includes a support/accommodation groove 510 formed to be recessed on an inner bottom surface of the accommodation case 100 in a longitudinal direction such that the heat conduction prevention member 400 is accommodated therein and a seating/accommodation groove 520 formed to be recessed at a lower side of the crucible 200 to correspond to the support/accommodation groove 510 such that the heat conduction prevention member 400 is accommodated therein.

In this case, a height of the heat conduction prevention member 400 is greater than the sum of a height of the support/accommodation groove 510 and a height of the seating/accommodation groove 520 such that the crucible 200 is prevented from being in direct contact with the accommodation case 100. Of course, although the support/accommodation groove 510 and the seating/accommodation groove 520 are shown in the drawing as having a semicircular shape, the present invention is not limited thereto, and the support/accommodation groove 510 and the seating/accommodation groove 520 may be formed in various shapes. The heat conduction prevention member 400 may be formed in a shape corresponding to the support/accommodation groove 510 and the seating/accommodation groove 520 and may also be formed integrally with the support/accommodation groove 510 and the seating/accommodation groove 520.

In addition, the heat conduction prevention member 400 may be made of at least one selected from among ceramic materials having low thermal conductivity and an insulating property, and it is advantageous for the heat conduction prevention member 400 to be made of a zirconia ceramic material among ceramic materials.

Accordingly, in a process in which the crucible 200 is heated to emit heat, the crucible 200 may be prevented from coming into contact with an inner surface of the accommodation case 100 by the heat conduction prevention member 400 to prevent heat from being transferred to the accommodation case 100, which minimizes a phenomenon in which heat loss occurs. Therefore, the crucible 200 can emit heat at a uniform temperature.

In addition, in order to prevent heat of the crucible 200 from being conducted to the accommodation case 100, the linear evaporation source may further include a plurality of heat loss prevention members 600 provided between the accommodation case 100 and the uniform heat distribution cover 300 to support the uniform heat distribution cover 300.

When the uniform heat distribution cover 300 receives heat from the crucible 200 so that a temperature thereof rises, the heat loss prevention members 600 maintains a temperature of the uniform heat distribution cover 300 by preventing a phenomenon in which heat of a portion supported by the accommodation case 100 is conducted to the accommodation case 100 causing heat loss.

In this case, the heat loss prevention member 600 may be prevented from being separated between the accommodation case 100 and the uniform heat distribution cover 300 by a separation prevention portion 700. To this end, the separation prevention portion 700 includes a support guide groove 710 formed to be recessed on an upper surface of the accommodation case 100 in a perimetric direction such that the heat loss prevention member 600 is accommodated therein and a seating guide groove 720 formed to be recessed on a lower surface of the uniform heat distribution cover 300 to correspond to the support guide groove 710 such that the heat loss prevention member 600 is accommodated therein.

Here, a height of the heat loss prevention member 600 may be greater than the sum of a height of the support guide groove 710 and the seating guide groove 720 such that the uniform heat distribution cover 300 is prevented from being in direct contact with the accommodation case 100.

Thus, when the uniform heat distribution cover 300 is seated on the accommodation case 100, the heat loss prevention member 600 may maintain a state in which the uniform heat distribution cover 300 is stably seated on the accommodation case 100 and may also guide a seating position of the uniform heat distribution cover 300 so that convenience of installation can be improved.

Of course, although the support guide groove 710 and the seating guide groove 720 are shown in the drawing as being formed in quadrangular shapes, the present invention is not limited thereto, and the support guide groove 710 and the seating guide groove 720 may be formed in various shapes. In addition, although the heat loss prevention member 600 is shown in the drawing as being formed in a circular ball shape, the heat loss prevention member 600 may be formed in a shape corresponding to the support guide groove 710 and the seating guide groove 720 or may be formed integrally with the support guide groove 710 or the seating guide groove 720.

In addition, the heat loss prevention member 600 may be made of at least one selected from among ceramic materials having low thermal conductivity and an insulating property, and it is advantageous for the heat loss prevention member 600 to be made of a zirconia ceramic material among ceramic materials.

In a process in which the uniform heat distribution cover 300 receives heat from the crucible 200 so that a temperature thereof rises, it is possible to offset influence of the accommodation case 100 in which a coolant circulates and prevent a phenomenon in which heat is transmitted to the accommodation case 100 and a temperature drops. Thus, the uniform heat distribution cover 300 may continue emitting uniform heat.

In addition, as shown in FIGS. 17 to 20, the linear evaporation source may further include an induction heater 800 which is accommodated in the accommodation space 110 and vaporizes a deposition material by heating the crucible 200 through high-frequency oscillation. A plurality of crucibles 200 may be accommodated in the induction heater 800 to be consecutively arranged in a longitudinal direction thereof.

Specifically, the induction heater 800 includes an induction coil member 810 which heats the crucible 200 and a connection terminal 820 which electrically connects the induction coil member 810 to a feed-through (not shown). In this case, the connection terminal 820 includes a positive terminal 821 and a negative terminal 822, and the positive terminal 821 and the negative terminal 822 are disposed to be spaced a predetermined distance from each other and insulated from each other.

Here, a plurality of induction coil members 810 may be vertically spaced from each other to surround a circumferential surface of the crucible 200 and may be connected to the connection terminal 840 in a parallel manner.

As a result, it is possible to increase intensity of an applied current while lowering a voltage applied to the induction coil member 810, thereby improving high-frequency oscillation performance of the induction coil member 810. Thus, it is possible to further improve an effect of heating the crucible 200 heated by the induction coil member 810.

Figure 17:
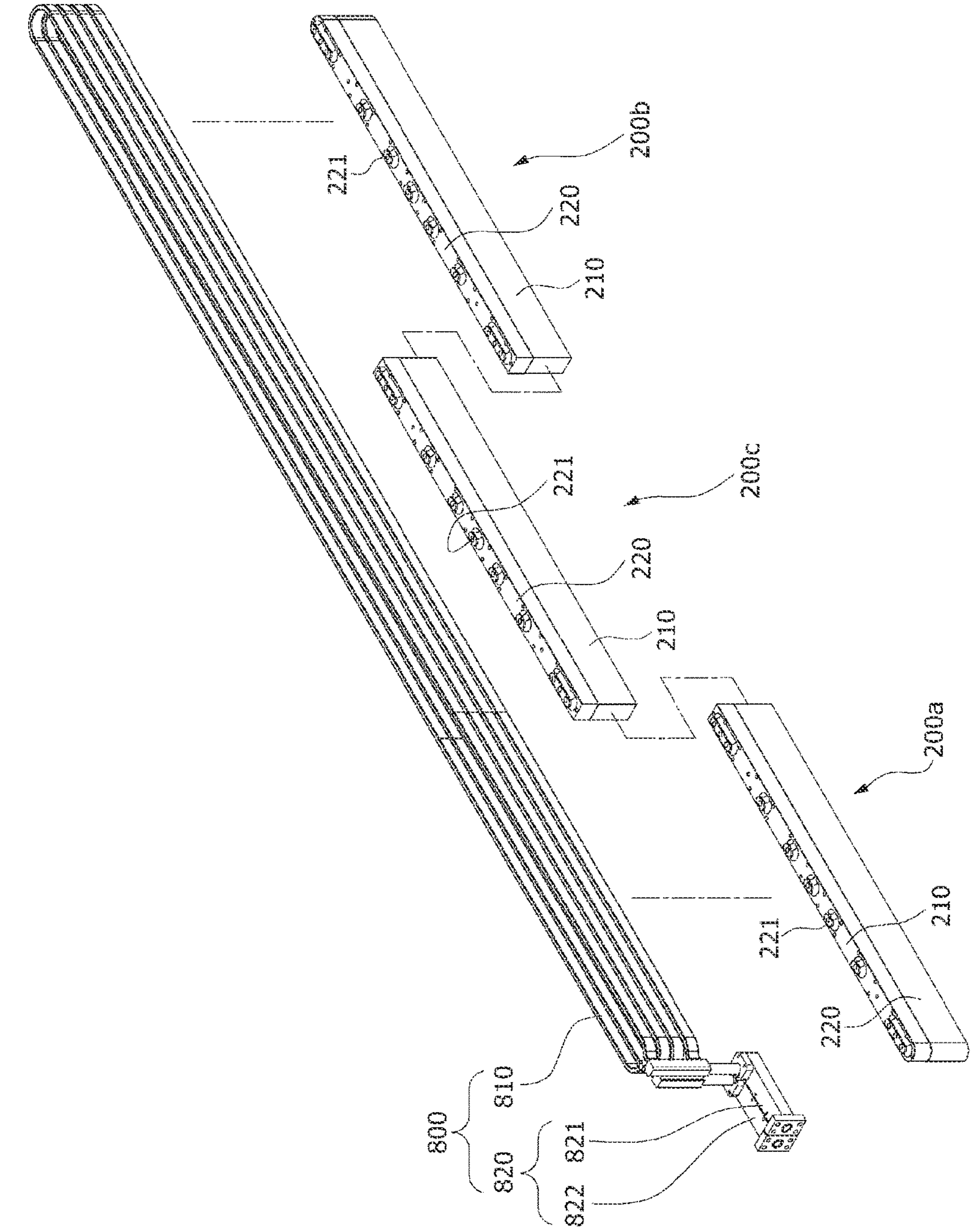
FIGS. 17 to 20 are perspective views illustrating an arrangement relationship between the crucible and an induction heater in the linear evaporation source according to one embodiment of the present invention.

In this case, as shown in FIG. 17, the crucibles 200 include a first crucible 200*a* accommodated to be disposed at one side of the induction heater 800, a second crucible 200*b* accommodated to be disposed at the other side of the induction heater 800, and a third crucible 200*c* interposed between the first crucible 200*a* and the second crucible 200*b*. The first crucible 200*a*, the second crucible 200*b*, and the third crucible 200*c* may be in electrical contact with each other.

Portions of the first crucible 200*a*, the second crucible 200*b*, and the third crucible 200*c* in contact with each other may be formed in various shapes but may have a flat surface as well as the same shape and size such that a contact area is maximized.

That is, in a state in which boundary portions are in contact with each other, when the first crucible 200*a*, the second crucible 200*b*, and the third crucible 200*c* are heated by high-frequency oscillation of the induction coil member 810, a contact area between the first crucible 200*a* and the third crucible 200*c* and a contact area between the second crucible 200*b* and the third crucible 200*c* may be electrically connected to each other so that a current may uniformly flow throughout, and thus a temperature may uniformly rise. Therefore, a deposition material can be deposited to a uniform thickness on portions of a deposition target corresponding to the boundary portions of the first crucible 200*a*, the second crucible 200*b*, and the third crucible 200*c*.

Figure 18:
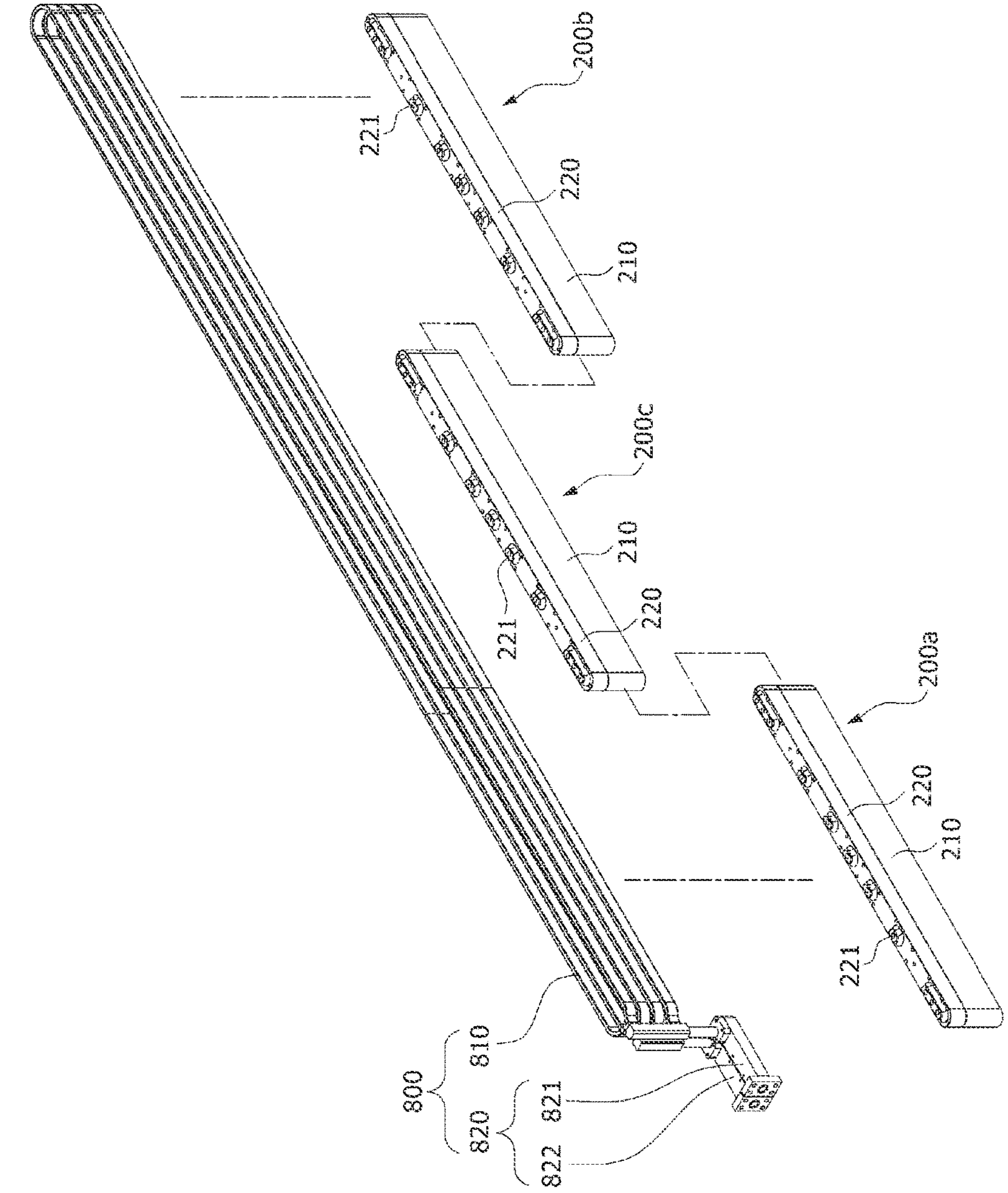

In addition, as shown in FIG. 18, in the crucibles 200, the first crucible 200*a*, the second crucible 200*b*, and the third crucible 200*c* may have the same shape and size, and the boundary portions may be spaced the same interval from each other.

That is, since a distance between the first crucible 200*a* and the third crucible 200*c* is the same as a distance between the second crucible 200*b* and the third crucible 200*c*, when the first crucible 200*a*, the second crucible 200*b*, and the third crucible 200*c* are heated by the induction coil member 810, currents with the same intensity may flow to the boundary portions between the first crucible 200*a*, the second crucible 200*b*, and the third crucible 200*c*. Therefore, a deposition material can be deposited to a uniform thickness on portions of a deposition target corresponding to the boundary portions of the first crucible 200*a*, the second crucible 200*b*, and the third crucible 200*c*.

Figure 19:
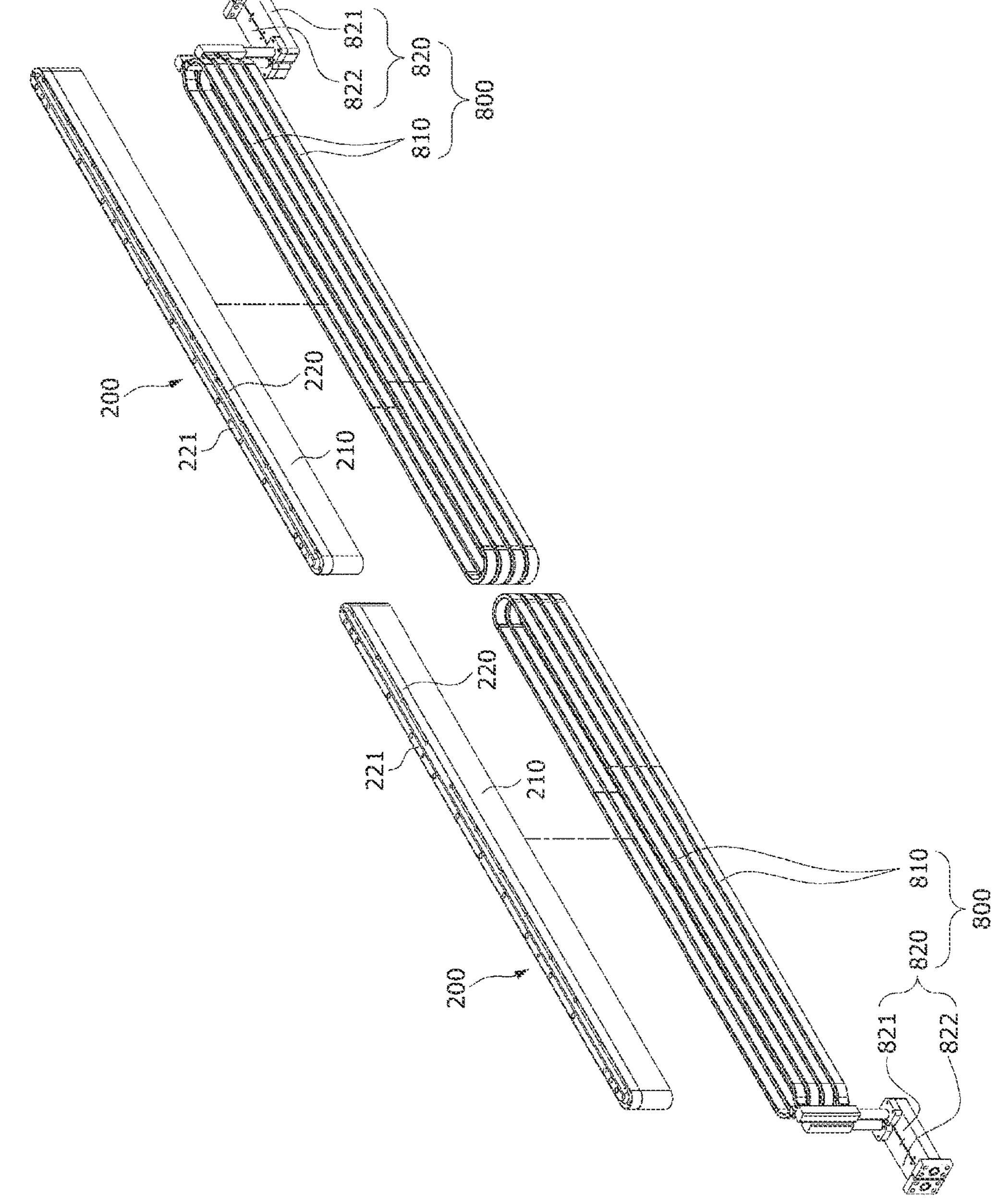

In addition, as shown in FIG. 19, the plurality of crucibles 200 may be spaced the same interval from each other, and each of a plurality of induction heaters 800 may be provided to accommodate one of the crucibles 200. Of course, although a pair of crucibles 200 are shown in the drawing for convenience as being provided to each be accommodated in one of the induction heaters 800, the present invention is not limited thereto, and various numbers of the crucibles 200 may be provided.

That is, the crucibles 200 may be individually heated by each induction heater 800 in a state in which the plurality of the crucibles 200 are spaced apart from each other in a length direction thereof, and thus an overall temperature may rise in a balanced manner, thereby depositing a deposition material to a uniform thickness on portions of a deposition target corresponding to the boundary portions of the crucibles 200.

Figure 20:
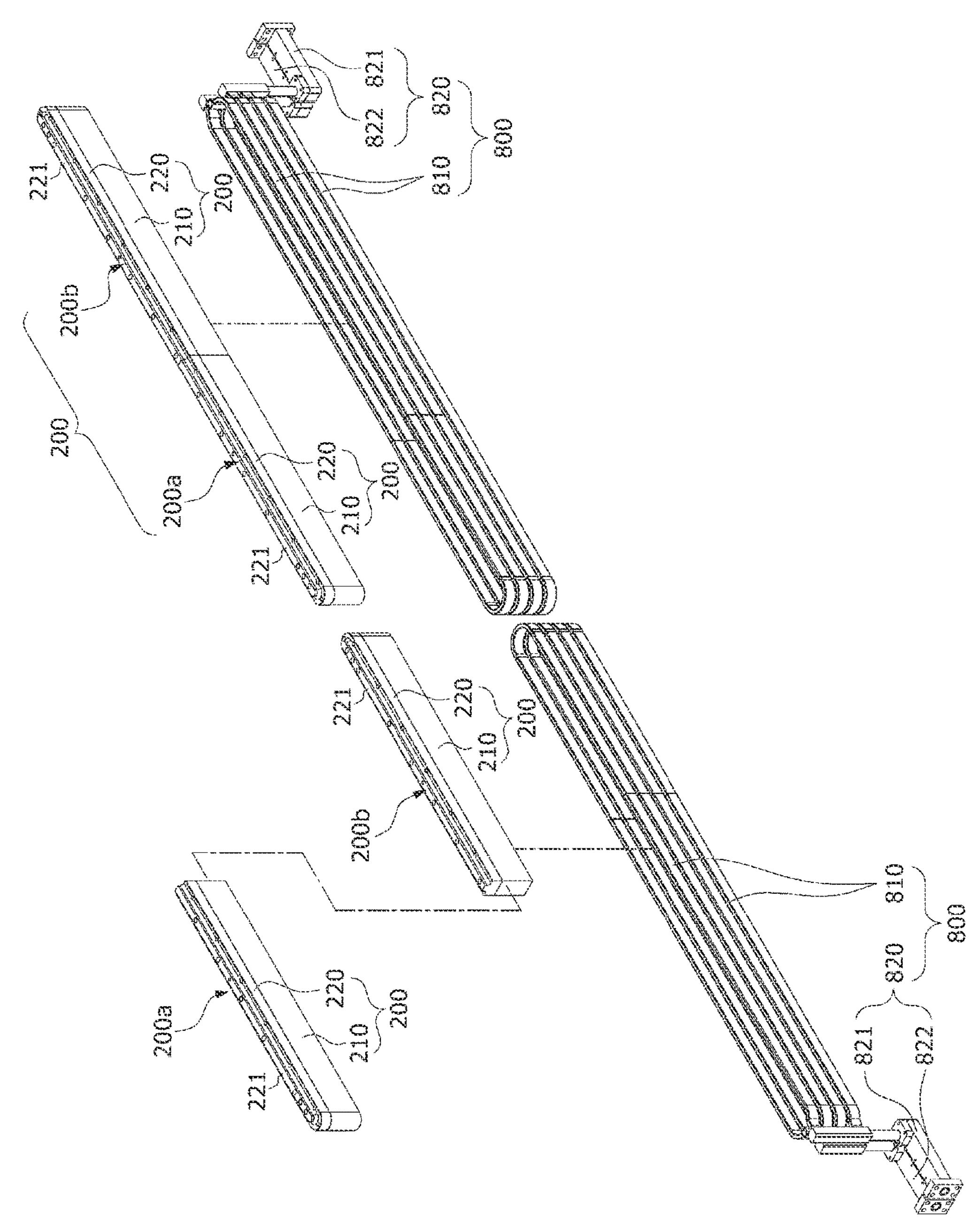

In this case, as shown in FIG. 20, the crucibles 200 may include a first crucible 200*a* accommodated to be disposed at one side of the induction heater 800 and a second crucible 200*b* accommodated to be disposed at the other side of the induction heater 800, and boundary portions thereof may be in close contact with each other.

Here, portions of the first crucible 200*a* and the second crucible 200*b* in contact with each other may be formed in various shapes but it is advantageous for them to have flat surfaces as well as the same shape and size such that a contact area is maximized.

Thus, when the first crucible 200*a* and the second crucible 200*b* are heated by high-frequency oscillation of the induction coil member 810 in a state in which the boundary portions are in contact with each other, contact portions of the first crucible 200*a* and the second crucible 200*b* may be electrically connected to each other, and at the same time, a uniform current may flow. Thus, a temperature may uniformly rise.

In the linear evaporation source according to the present invention configured as described above, when the uniform heat distribution cover 300 is seated on the accommodation case 100, since the backflow prevention fitting portion 320 of the uniform heat distribution cover 300 is provided to be fitted onto the discharge nozzle 221 of the crucible 200 provided inside the accommodation case 100 while forming the communication space 322, a gap formed between the discharge nozzle 221 and the backflow prevention fitting portion 320 can be removed to improve airtightness of the discharge nozzle 221 and the backflow prevention fitting portion 320, and since the backflow prevention fitting portion 320 may receive heat while accommodated in the accommodation space 110, the uniformity of a temperature can be effectively maintained.

Accordingly, when the crucible 200 vaporizes and discharges a deposition material from the discharge nozzle 221, in a process in which the deposition material is lifted toward a deposition target inside the communication space 322, a phenomenon in which the deposition material moves laterally is suppressed, and thus a deposition thickness of the deposition target becomes uniform, which can improve the quality of the deposition target.

In addition, in the linear evaporation source according to the present invention, since the heat loss prevention member 600 having an insulating property and simultaneously minimizing heat conduction is interposed between the accommodation case 100 and the uniform heat distribution cover 300, the uniform heat distribution cover 300 can be spaced apart from the accommodation case 100 while contact with the accommodation case 100 is prevented. Therefore, a temperature of an entire area can be maintained uniform in a process in which the uniform heat distribution cover 300 receives heat from the crucible 200, thereby improving heating performance of the crucible 200.

In addition, in the linear evaporation source according to the present invention, the heat conduction prevention member 400 having an insulating property and simultaneously minimizing heat conduction is interposed between the accommodation case 100 and the crucible 200, thereby preventing a phenomenon in which the crucible 200 comes into direct contact with the accommodation case 100. As a result, in a state in which the crucible 200 is inductively heated so that a temperature thereof rises, heat is prevented from being transferred to the accommodation case 100, thereby improving heating performance.

In the linear evaporation source according to the present invention, the crucible 200 is disposed in a structure in which, when the seating flange 232 is seated on the support flange 231 and inserted into and accommodated in the first fastening hole 233*a* and the second fastening hole 233*b*, when the fastening bolt 233*c* has been fastened to the fastening nut 233*d* accommodated in the second fastening hole 233*b*, the fastening bolt 233*c* and the fastening nut 233*d* are prevented from protruding from outer lines of the support flange 231 and the seating flange 232. Therefore, a flow of current is prevented from concentrating on the fastening bolt 233*c* or the fastening nut 233*d* during an induction heating process of the storage case 210 and the seating cover 220, thereby preventing the fastening bolt 233*c* or fastening nut 233*d* from being deformed or damaged and simultaneously improving heating performance with respect to the storage case 210 and the seating cover 220.

In addition, in the linear evaporation source according to the present invention, in the crucible 200, when the seating flange 232 is seated on the support flange 231, the airtightness groove 234*a* and the airtightness protrusion 234*b* of the airtightness reinforcement part 234 are coupled to be aligned with each other, thereby improving the installation convenience of the seating cover 220 with respect to the storage case 210 and simultaneously improving airtightness performance of the support flange 231 and the seating flange 232.

In the linear evaporation source according to the present invention, the crucible 200 has a structure in which, when the storage case 210 is heated and a temperature of the body 241 rises, the thermal medium 243*b* filling the filling space 243*a* transfers heat from a portion of the body 241 with a high temperature to a portion with a low temperature so that the overall temperature of the body 241 uniformly rises. Therefore, when a deposition material accommodated in the storage space 211 passes through the body 241 through each of the air pressure maintenance holes 242, the occurrence of a temperature deviation can be prevented, and thus the deposition material can be formed to have a uniform thickness with respect to a deposition target.

A linear evaporation source according to the present invention has a structure that receives heat from a crucible such that a temperature is uniformly distributed while a uniform heat distribution cover is seated on an accommodation case, there is an effect of depositing a deposition material to a uniform thickness on a deposition target.

In addition, according to the present invention, a heat conduction prevention member is provided between a crucible and an accommodation case to prevent heat of the crucible from being conducted to the accommodation case, thereby obtaining an effect of improving heat insulation performance of the crucible.

Furthermore, according to the present invention, since a heat loss prevention member is provided between a uniform heat distribution cover and an accommodation case to prevent heat loss of the uniform heat distribution cover due to the accommodation case, an effect of uniformly maintaining a heat-emission temperature of the uniform heat distribution cover is obtained.

In addition, according to the present invention, since a leakage prevention connector connects a storage case and a seating cover such that a vaporized deposition material is prevented from leaking between the storage case and the seating cover and heat loss of the storage case and the seating cover is prevented, there is an effect of improving airtightness of a crucible.

In addition, according to the present invention, in a process in which a deposition material filling a storage case is vaporized and discharged from a discharge nozzle of a seating cover, a uniform discharge guide part guides the deposition material to be discharged at a uniform temperature and air pressure, and thus there is an effect of depositing the deposition material to a uniform deposition thickness on a deposition target.

While the present invention has been described with reference to embodiments shown in the drawings, these should be considered in a descriptive sense only, and it will be understood by those skilled in the art that various alterations and other equivalent embodiments may be made. Accordingly, the true scope of protection of the present invention should be defined only by the appended claims.

What is claimed is:

1. A linear evaporation source comprising:

an accommodation case forming an accommodation space with an open upper side;

a crucible accommodated in the accommodation space and configured to discharge a deposition material; and a uniform heat distribution cover configured to cover the accommodation case to uniformly distribute a temperature by receiving heat from the crucible and a plurality of heat conduction prevention members provided between the crucible and the accommodation case to support the crucible such that the heat of the crucible is prevented from being conducted to the accommodation case, wherein the crucible includes:

a storage case forming a storage space with an open upper side to store the deposition material;

a seating cover which is seated on the storage case and includes a discharge nozzle which communicates with the storage space; and a leakage prevention connector configured to connect the storage case and the seating cover to prevent the vaporized deposition material from leaking between the storage case and the seating cover, wherein the leakage prevention connector includes:

a support flange extending in a perimetric direction on the storage case;

a seating flange extending in the perimetric direction below the seating cover to be seated on the support flange; and a heat loss prevention coupling part configured to couple the support flange and the seating flange in close contact with each other, wherein the heat loss prevention coupling part includes: a plurality of first fastening holes formed in the support flange and a plurality of second fastening holes formed in the seating flange to communicate with the first fastening holes and a plurality of fastening bolts inserted into the first fastening holes and the second fastening holes, and a plurality of fastening nuts fastened to the fastening bolts to prevent the fastening bolts from being separated from the first fastening holes and the second fastening holes, wherein each fastening bolt and a corresponding fastening nut have structures that are prevented from respectively protruding from the support flange and the seating flange when the fastening bolt and the fastening nut have been fastened to each other while inserted into the first fastening hole and the second fastening hole, wherein the heat conduction prevention members are prevented from moving in a width direction of the accommodation case by a movement prevention portion, wherein the movement prevention portion includes: a support-accommodation groove formed to be recessed on an inner bottom surface of the accommodation case in a longitudinal direction such that the heat conduction prevention members are accommodated therein and a seating-accommodation groove formed to be recessed at a lower side of the crucible to correspond to the support-accommodation groove such that the heat conduction prevention members are accommodated therein, wherein a height of the heat conduction prevention members are greater than the sum of a height of the support-accommodation groove and a height of the support-accommodation groove such that the crucible is prevented from being in direct contact with the accommodation case.

2. The linear evaporation source of claim 1, further comprising a plurality of heat loss prevention members provided between the accommodation case and the uniform heat distribution cover to support the uniform heat distribution cover such that the heat of the uniform heat distribution cover is prevented from being conducted to the accommodation case.

3. The linear evaporation source of claim 2, wherein the heat loss prevention members are prevented from being separated between the accommodation case and the uniform heat distribution cover by a separation prevention portion.

4. The linear evaporation source of claim 1, wherein the uniform heat distribution cover includes:

a seating portion seated on the accommodation case; and a backflow prevention fitting portion which is provided at the seating portion and has a fitting hole inserted onto a discharge nozzle provided in the crucible to prevent a backflow of the deposition material discharged from the crucible.

5. The linear evaporation source of claim 4, wherein the backflow prevention fitting portion is accommodated in the accommodation space and formed to extend from the seating portion to form a communication space which communicates with the discharge nozzle.

6. The linear evaporation source of claim 5, wherein the fitting hole is formed at a position that is at a lower level than a position of an end of the discharge nozzle.

7. The linear evaporation source of claim 1, wherein the crucible further includes a uniform discharge guide part disposed in the storage space to guide the deposition material to be discharged from the discharge nozzle at a uniform temperature and air pressure.

8. The linear evaporation source of claim 7, wherein the uniform discharge guide part includes:

a body accommodated and seated in the storage space to be heated together with the storage case; and a plurality of air pressure maintenance holes formed in the body to uniformly maintain air pressure of the deposition material before the deposition material is discharged from the discharge nozzle.

9. The linear evaporation source of claim 8, wherein the uniform discharge guide part further includes a temperature deviation prevention portion provided in the body to prevent occurrence of a temperature deviation in the body.

10. The linear evaporation source of claim 1, further comprising an induction heater accommodated in the accommodation space and configured to inductively heat the crucible to vaporize the deposition material, wherein the crucible is provided as a plurality of crucibles to be accommodated in the induction heater.

11. The linear evaporation source of claim 10, wherein the crucibles are in electrical contact with each other while accommodated in the induction heater.

* * * * *